(12) United States Patent
Nagatomo et al.

(10) Patent No.: US 8,881,067 B2
(45) Date of Patent: Nov. 4, 2014

(54) METHOD AND APPARATUS FOR MONITORING CROSS-SECTIONAL SHAPE OF A PATTERN FORMED ON A SEMICONDUCTOR DEVICE

(71) Applicants: Wataru Nagatomo, Yokohama (JP); Atsushi Miyamoto, Yokohama (JP); Hidetoshi Morokuma, Hitachinaka (JP)

(72) Inventors: Wataru Nagatomo, Yokohama (JP); Atsushi Miyamoto, Yokohama (JP); Hidetoshi Morokuma, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/738,795

(22) Filed: Jan. 10, 2013

(65) Prior Publication Data
US 2013/0195346 A1 Aug. 1, 2013

Related U.S. Application Data

(63) Continuation of application No. 11/673,065, filed on Feb. 9, 2007, now Pat. No. 8,356,260.

(30) Foreign Application Priority Data

Feb. 23, 2006 (JP) ................. 2006-046609

(51) Int. Cl.
*G06F 17/50* (2006.01)
*G06K 9/00* (2006.01)
(Continued)

(52) U.S. Cl.
CPC ............ *G03F 7/70625* (2013.01); *G06T 7/001* (2013.01); *G06K 9/00798* (2013.01);
(Continued)

(58) Field of Classification Search
CPC ....... G03F 7/70625; G03F 7/705; G03F 1/84; G03F 7/70608; G03F 7/70516; G03F 7/70525; G03F 7/70683
USPC .......................................................... 716/51
See application file for complete search history.

(56) References Cited

U.S. PATENT DOCUMENTS

2004/0156223 A1* 8/2004 Tanaka et al. ................. 365/145

FOREIGN PATENT DOCUMENTS

JP 10-125749 5/1998

OTHER PUBLICATIONS

U.S. Appl. No. 11/592,175, filed Nov. 3, 2006, Nagatomo et al.
(Continued)

*Primary Examiner* — Vuthe Siek
*Assistant Examiner* — Aric Lin
(74) *Attorney, Agent, or Firm* — Antonelli, Terry, Stout & Kraus, LLP.

(57) ABSTRACT

To enable SEM-based management of a cross-sectional shape or manufacturing process parameters of a semiconductor device pattern to be measured, the association between the shape or parameters and SEM image characteristic quantities effective for estimating the shape or parameters is saved as learning data. The image characteristic quantities are collated with learning data to estimate the shape or to monitor the process parameters. Accuracy and reliability is achievable by calculating three kinds of reliability (reliability of the image characteristic quantities, reliability of estimation engines, and reliability of estimating results) based on the distribution of the image characteristic quantities and then judging whether additional learning is necessary, or selecting and adjusting image characteristic quantities and estimation engine based on the reliability.

14 Claims, 23 Drawing Sheets

(51) Int. Cl.
*G03F 7/20* (2006.01)
*H01J 37/22* (2006.01)
*G06T 7/60* (2006.01)
*G06K 9/48* (2006.01)
*H01J 37/28* (2006.01)
*G06T 7/00* (2006.01)

(52) U.S. Cl.
CPC ............... *H01J 37/222* (2013.01); *G06T 7/602* (2013.01); *G06K 9/48* (2013.01); *H01J 2237/2804* (2013.01); *H01J 2237/24592* (2013.01); *G06T 2207/30148* (2013.01); *H01J 2237/2817* (2013.01); *H01J 37/28* (2013.01)

USPC .......................................................... 716/51

(56) References Cited

OTHER PUBLICATIONS

Bingham, et al., "Sidewall structure estimation from CD-SEM for lithographic process control", Process and Materials Characterization and Diagnostics in IC Manufacturing, Proc. of SPIE, v. 5041, Feb. 2003, pp. 115-126.

* cited by examiner

*(Prior Art)*
FIG. 2A
*(Prior Art)*
FIG. 2B
*(Prior Art)*
FIG. 2C
*(Prior Art)*
FIG. 2D
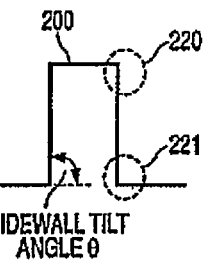
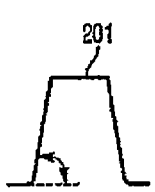
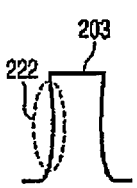
*(Prior Art)*
FIG. 2E
*(Prior Art)*
FIG. 2F
*(Prior Art)*
FIG. 2G
*(Prior Art)*
FIG. 2H
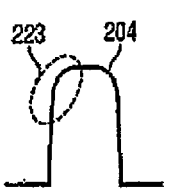
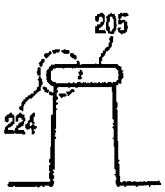
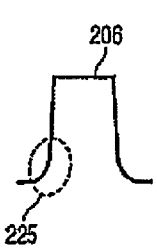
*(Prior Art)*
FIG. 2I
*(Prior Art)*
FIG. 2J
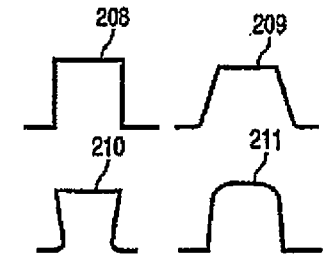
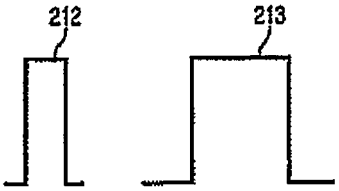

UPPER GRAPH: CROSS SECTIONAL SHAPE
LOWER GRAPH: LINE PROFILE

UPPER GRAPH: CROSS SECTIONAL SHAPE
LOWER GRAPH: LINE PROFILE

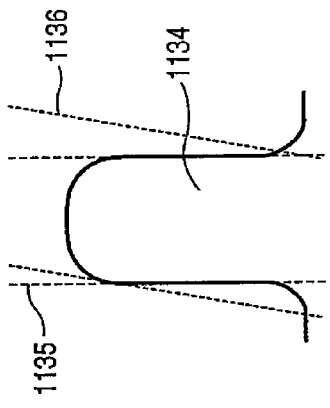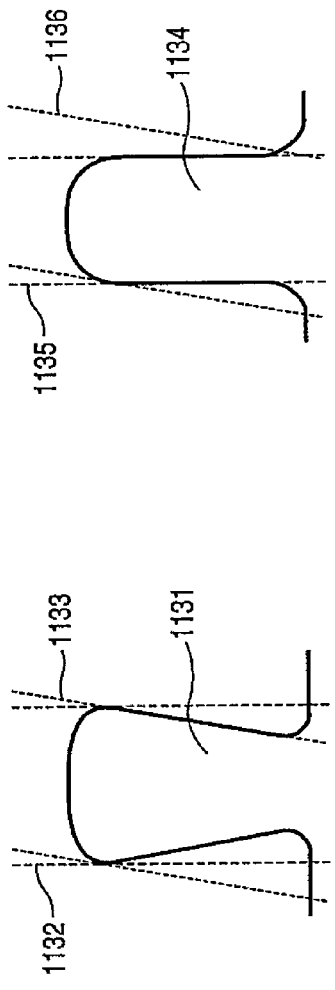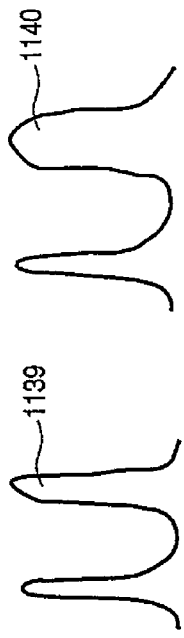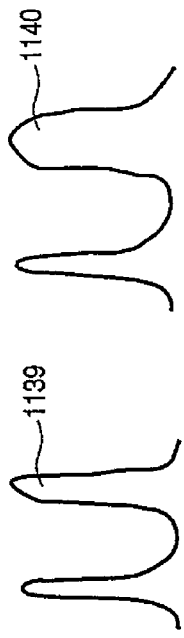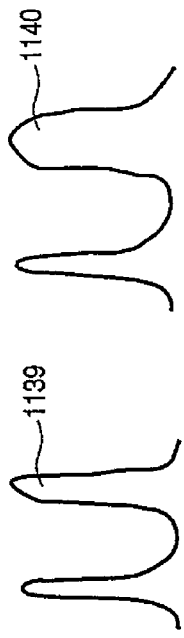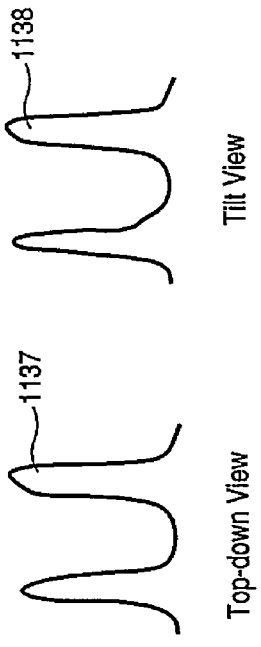

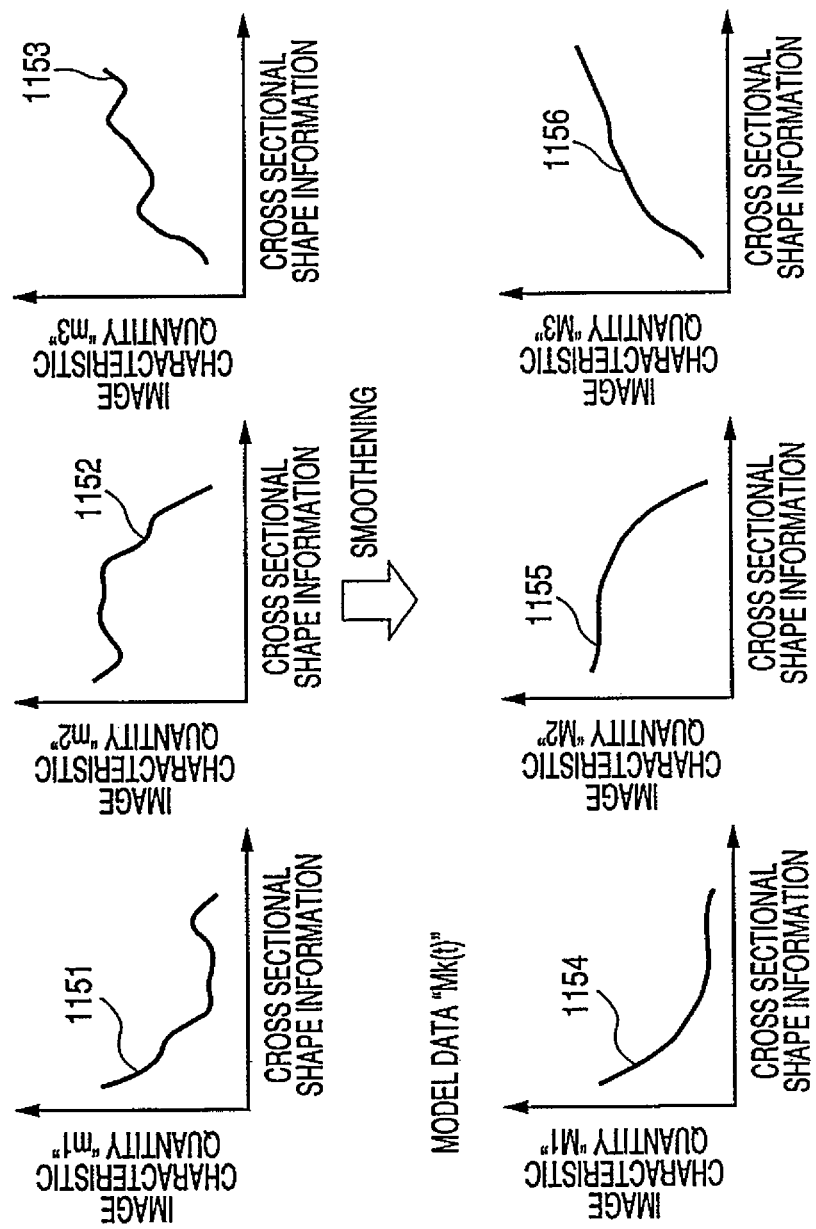

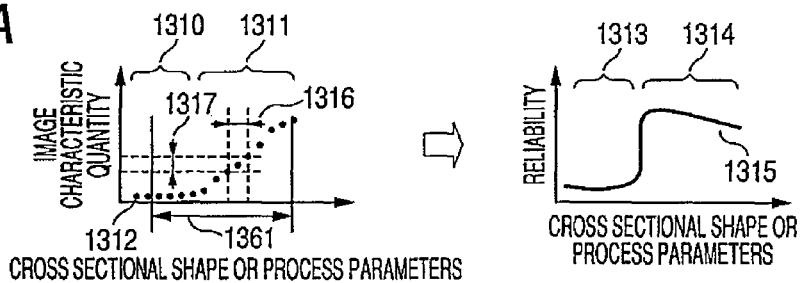
FIG. 20A (1) SENSITIVITY
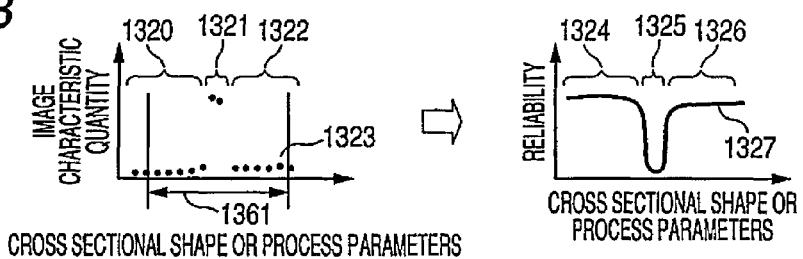
FIG. 20B (2) CONTINUITY
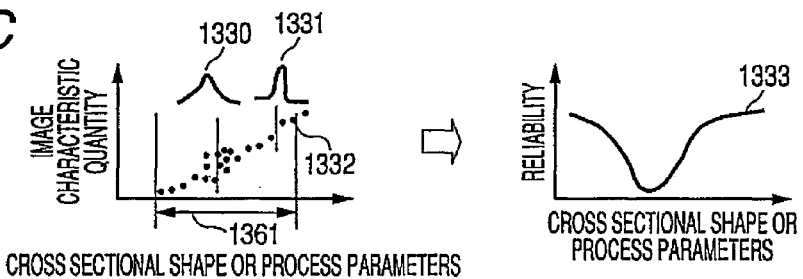
FIG. 20C (3) SEPARATION LEVEL
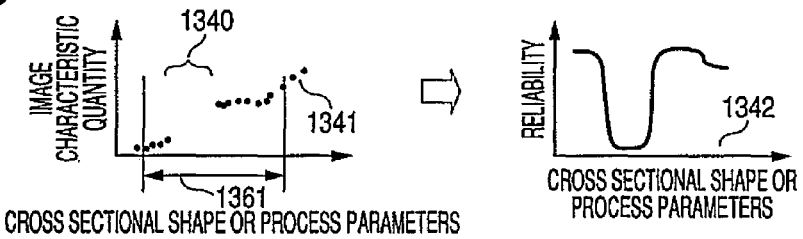
FIG. 20D (4) LEARNING DENSITY
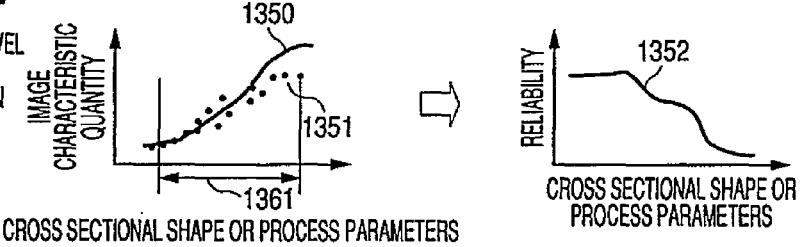
FIG. 20E (5) ADEQUACY LEVEL OF MODEL APPLICATION

METHOD AND APPARATUS FOR MONITORING CROSS-SECTIONAL SHAPE OF A PATTERN FORMED ON A SEMICONDUCTOR DEVICE

CROSS REFERENCE TO RELATED APPLICATION

The present application is a Continuation of U.S. application Ser. No. 11/673,065 filed Feb. 9, 2007, and claims priority from Japanese Application No. JP2006-046609 filed on Feb. 23, 2006, the contents of each of which are hereby incorporated by reference into this application.

BACKGROUND OF THE INVENTION

The present invention relates generally to methods and systems for semiconductor-manufacturing process estimating intended to evaluate and manage circuit patterns formed on semiconductor wafers. More particularly, the invention relates to a method and apparatus for estimating a cross-sectional shape of a pattern using a SEM image.

The characteristics of conventional transistor devices depend primarily on the width of gate wiring (gate length), and during semiconductor-manufacturing processes, the width of pattern wiring has been mainly measured and managed using critical-dimension scanning electron microscopy (CD-SEM). However, as the formation of finer-structured semiconductor circuit patterns accelerated the tendency towards shorter channeling of transistors, the cross-sectional shapes of the semiconductor patterns have become more important as one of major influential factors upon the transistor device characteristics, in addition to the above-mentioned wiring width.

Japanese Patent Laid-Open No. Hei 10-125749 describes an inspection apparatus for semiconductor products and a method for manufacturing a semiconductor product, which are intended to determine the acceptability of processed patterns formed on a surface to be processed, by matching parameters, combining a simulated three-dimensional geometric model (ideal image) and the three-dimensional image data acquired from the surface to be processed, displaying the combined image on a display screen, and conducting evaluations based on display results.

SUMMARY OF THE INVENTION

With decrease in design margins along with the miniaturization and high density of LSI chips, appropriate management of patterns formed during a semiconductor manufacturing process becomes impossible only with conventional dimension management. Under these circumstances, it is being demanded that cross-sectional shapes of patterns formed be managed in addition to two-dimensional management.

However, it has been difficult to evaluate and manage various cross-sectional shapes with a conventional CD-SEM, since the conventional technique has been used primarily for measuring two-dimensional shapes from a vertical direction (from above the wafer vertically), such as wiring pattern line widths and contact hole diameters.

In addition, the evaluation and management of various cross-sectional shapes have presented the following problems:
(1) It has been difficult to measure the cross-sectional shapes of formed patterns or part or all of pattern-forming process parameters based on a SEM image acquired from the top-down (vertical) direction (hereinafter, this image is called "top-down SEM image").
(2) There has not been a method of judging the acceptability of a formed pattern based on its cross-sectional shape or from its process parameter measurement results.
(3) There has not been a method for calculating, if a pattern to be formed is defective, data for adjusting the process parameters used in a process causing defects in the formation of the pattern and feeding the calculated data back to the process site.

An object of the present invention is to provide a method and apparatus for estimating cross-sectional shapes of patterns formed on a semiconductor device, the method and apparatus being adapted such that a cross-sectional shape of a pattern to be measured, or all or part of associated process parameters can be managed using a SEM, with high throughput, and without damaging the pattern.

Another object of the present invention is to provide a method and apparatus for estimating cross-sectional shapes of patterns formed on a semiconductor device, the method and apparatus being adapted to enable advanced process management with a SEM or the like by estimating a cross-sectional shape or process parameters of a pattern to be measured to determine the acceptability of the pattern to be measured based on the estimation results, or by calculating deviations from appropriate data (specification values) and feeding data for adjusting the process parameters back to a process site such as an exposure process site, etching process site, or exposure mask design site, as required.

The present invention attains the above objects by providing a method and apparatus for estimating a cross-sectional shape of a pattern formed on a semiconductor device, the method and apparatus featuring the following:

In one aspect of the present invention relating to a method and apparatus for estimating a cross-sectional shape of a pattern formed on a semiconductor device, in order to judge whether sufficient estimation accuracy can be obtained in estimated fluctuation ranges of various parameters used for estimation, the invention presents the number of learning data samples or a distribution state thereof to a user as required, calculates at least one index value (reliability) intended to evaluate the number of learning data samples or the distribution state thereof, and further presents the calculated index value (reliability) to the user as required. The index value is obtained by analyzing a distribution state of image characteristic quantities for changes in the cross-sectional shape or process parameters of the pattern, against the estimated fluctuation ranges of the parameters to be estimated, and quantifying the distribution in various terms such as density, continuity, and variance, in contrast to the acquired learning data, for example. The index value is hereinafter called "reliability of the image characteristics quantities."

The apparatus for estimating a cross-sectional shape of a pattern according to the present invention is constructed to include: learning means to collect learning data which includes SEM images of patterns each having various cross-sectional shapes and select an estimation engine for estimating the cross-sectional shape of each pattern; and performance processing means to process a SEM image acquired from SEM that images of the pattern on a sample (semiconductor wafer), calculate a characteristic quantity of the SEM image, conduct necessary processing with the selected estimation engine, and estimate the cross-sectional shape of the pattern on the sample. The performance processing means includes an output unit that outputs information on the estimated cross-sectional shape of the pattern on the sample, together with information on reliability of the estimation results.

In addition, in the present invention, the apparatus having the above construction is used to conduct the learning process step of collecting the learning data which includes the SEM images of the patterns each having various cross-sectional shapes, and selecting the estimation engine for estimating the cross-sectional shape of each pattern, and the performance process step of processing the SEM image acquired from SEM imaging of the pattern on the sample, calculating the characteristic quantity of the SEM image, conducting necessary processing with the selected estimation engine, and estimating the cross-sectional shape of the pattern on the sample, and generating in the performance process step an output of the information relating to the estimated cross-sectional shape of the pattern on the sample, together with the information on reliability of the estimation results.

In another aspect of the present invention relating to a method and apparatus for estimating a cross-sectional shape of a pattern of a semiconductor device in accordance with a SEM image obtained from the pattern formed on a sample using a CD-SEM through a required manufacturing process for the semiconductor device during manufacturing processes, the invention is adapted to include a learning process step and a performance process step. The learning process step includes: a learning data registration substep for collecting a first SEM image group of a first pattern group of various cross-sectional shapes beforehand as a learning sample using the CD-SEM, further collecting a first cross-sectional shape information group of the first pattern group using another measurement apparatus, and thus registering a relationship between the collected first SEM image group and the collected first cross-sectional shape information group as learning data in a database; an image characteristic quantity calculation substep for calculating a first distribution group of image characteristic quantities correlated to three-dimensional geometric changes in the first pattern group, from the first SEM image group within the learning data registered in the learning data registration substep; a reliability calculation substep for calculating, based on the first distribution group of image characteristic quantities within estimated fluctuation ranges of the cross-sectional shapes, calculated in the image characteristic quantity calculation substep in the manufacturing process, one or a plurality of reliability of the first image characteristic quantity group in the learning data, reliability of a first estimation engine group for estimating the cross-sectional shapes or a process parameter group, and reliability of a first estimation results group on the cross-sectional shape group estimated using the first estimation engine group; and a determination substep for determining the learning data and a first estimation engine on the basis of the reliability value or plural reliability values calculated in the reliability calculation substep to register the learning data and the first estimation engine in the database. The performance process step includes: a SEM image acquisition substep for acquiring a SEM image of the pattern to be measured; an image characteristic quantity calculation substep for calculating an image characteristic quantity from the SEM image of the pattern to be measured; a estimating substep for estimating a cross-sectional shape of the pattern to be measured in accordance with both the image characteristic quantity calculated in the image characteristic quantity calculation substep, and the learning data and first estimation engine determined in the determination substep; and a reliability calculation substep for calculating reliability of the estimation results obtained in the estimating substep.

In another aspect of the present invention relating to a method and system for semiconductor-manufacturing process monitoring intended for pattern-forming process parameter estimation based on a SEM image obtained from CD-SEM observation of a pattern formed on a sample through a required manufacturing process during manufacturing processes for a semiconductor device, the invention is adapted to include a learning process step and a performance process step. The learning process step includes: a learning data registration substep for collecting a second SEM image group of a second pattern group formed using various process parameters using the CD-SEM as a learning sample beforehand, further collecting a second cross-sectional shape information group of the second pattern group using another measurement apparatus, and registering a relationship between the collected second SEM image group and the collected second cross-sectional shape information group as learning data in a database; an image characteristic quantity calculation substep for calculating a second distribution group of image characteristic quantities correlated to three-dimensional geometric changes in the second pattern group, from the second SEM image group within the learning data registered in the learning data registration substep; a reliability calculation substep for calculating, based on the second distribution group of image characteristic quantities within estimated fluctuation ranges of the process parameters, calculated in the image characteristic quantity calculation substep in the manufacturing process, one or a plurality of reliability of the second image characteristic quantity group in the learning data, reliability of a second estimation engine group for estimating the process parameters, and reliability of a second group of estimation results on the process parameters estimated using the second estimation engine group; and a determination substep for determining the learning data and a second estimation engine on the basis of the reliability value or plural reliability values calculated in the reliability calculation substep. The performance process step includes: a SEM image acquisition substep for acquiring a SEM image of the pattern to be measured; an image characteristic quantity calculation substep for calculating an image characteristic quantity from the SEM image of the pattern to be measured; a estimating substep for estimating a process parameter of the pattern to be measured, in accordance with both the image characteristic quantity calculated in the image characteristic quantity calculation substep, and the learning data and second estimation engine determined in the determination substep; and a reliability calculation substep for calculating reliability of the estimation results obtained in the estimating substep.

According to the present invention, during process management with a learning-type engine to estimate a cross-sectional shape or process parameters of the pattern to be measured, it is possible to calculate the above-mentioned reliability for judging whether the above-mentioned number of learning data samples or the above-mentioned distribution state is appropriate for obtaining sufficient estimation accuracy with respect to estimated fluctuation ranges of the parameters used for estimation. It is also possible to present the reliability to a user and prompt the user to perform additional learning as required. In addition, when additional learning is necessary, it is possible to conduct estimation with high accuracy and high reliability by providing necessary samples for additional learning to the user and prompting the user to perform additional learning.

Furthermore, according to the present invention, it is possible to provide the user with reliability that is a reference value to select image characteristic quantities used for estimating cross-sectional shapes or process parameters, select estimation engines, and adjust a weight between the image characteristic quantities or adjust a weight between the estimation engines so that the user can use the reliability to conduct appropriate selections or weight adjustments for the particular subject to be estimated. Thus, highly accurate and highly reliable estimation becomes possible.

These and other objects, features, and advantages of the invention will be apparent from the following more particular description of preferred embodiments of the invention, as illustrated in the accompanying drawings.

BRIEF DESCRIPTION OF THE DRAWINGS

FIG. 2A is a diagram showing an example of the cross-sectional shape that is typically considered to be most desirable, FIG. 2B is a diagram showing a shape of a forward tapered pattern, and FIG. 2C is a diagram showing a shape of an inverse tapered pattern, FIG. 2D is a diagram showing a pattern shape called "bowing", FIG. 2E is a diagram showing a pattern shape that is round at upper corners, FIG. 2F is a diagram showing a pattern shape that is protuberant at upper corners, FIG. 2G is a diagram that shows a pattern having a skirt shape at bottom, FIG. 2H is a diagram that shows a pattern having portions called "notches" in cross section, FIG. 2I is a diagram showing a thinned-down pattern shape, and FIG. 2J is a diagram showing a pattern with a width wider than a desired pattern;

FIG. 14A is a cross-sectional view of a pattern having sidewalls of an inverse tapered overhang shape in cross section, FIG. 14B is a cross-sectional view of a pattern of a normal cross-sectional shape, FIG. 14C shows a line profile calculated from a top-down SEM image of the patter of FIG. 14A that has an inverse tapered overhang cross-sectional shape, FIG. 14D shows a line profile calculated from a tilt SEM image obtained by inclining the pattern of FIG. 14A that has an inverse tapered overhang cross-sectional shape, FIG. 14E shows a line profile calculated from a top-down SEM image of the pattern having a normal cross-sectional shape, and FIG. 14F shows a line profile calculated from a tilt SEM image of the pattern having a normal cross-sectional shape;

FIG. 15 illustrates a method of creating a set of learning data for estimating a cross-sectional shape; upper graphs each show a distribution state of a characteristic quantity "mk(t)" which has been calculated from a CD-SEM image, and lower graphs each show a distribution state of model data "Mk(t)" with which a smoothing process has been provided;

FIG. 20A is a diagram explaining a reliability index value (in right-side graph) of sensitivity with respect to changes in the cross-sectional shape or process parameters derived from a distribution (left-side graph) of image characteristic quantities obtained with the changes in the cross-sectional shape or process parameters, FIG. 20B is a diagram explaining a reliability index value (in right-side graph) of continuity with respect to changes in the cross-sectional shape or process parameters derived from a distribution (left-side graph) of image characteristic quantities obtained with the changes in the cross-sectional shape or process parameters, FIG. 20C is a diagram explaining a reliability index value (in right-side graph) of a separation level with respect to changes in the cross-sectional shape or process parameters derived from a distribution (left-side graph) of image characteristic quantities obtained with the changes in the cross-sectional shape or process parameters, FIG. 20D is a diagram explaining a reliability index value (in right-side graph) of learning density with respect to changes in the cross-sectional shape or process parameters derived from a distribution (left-side graph) of image characteristic quantities obtained with the changes in the cross-sectional shape or process parameters, and FIG. 20E is a diagram explaining a reliability index value (in right-side graph) of a model application appropriateness level with respect to changes in the cross-sectional shape or process parameters derived from a distribution (left-side graph) of image characteristic quantities obtained with the changes in the cross-sectional shape or process parameters;

DESCRIPTION OF THE PREFERRED EMBODIMENTS

Figure 1A:
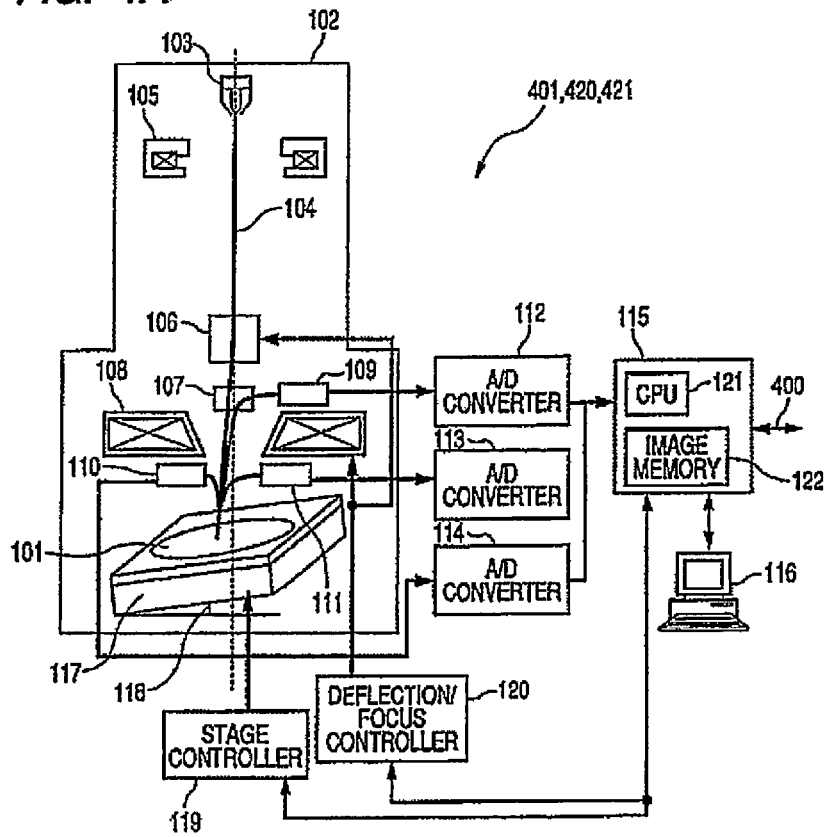
FIG. 1A is a schematic configuration diagram of a scanning electron microscope.

Embodiments of a system and a method for monitoring semiconductor manufacturing processes according to the present invention, adapted to evaluate and manage a circuit pattern formed on a semiconductor wafer during the semiconductor manufacturing processes, will be described using the accompanying drawings. More particularly, the embodiments relate to cross-sectional shape and process parameter management of a semiconductor pattern using a CD-SEM apparatus.

A method for estimating a cross-sectional shape of a pattern by using a SEM image to conduct process management with a learning-type engine, as described in U.S. patent application Ser. No. 11/592,175 filed by the present inventors, is proposed as an example of the above-outlined method for managing a cross-sectional shape of a semiconductor pattern. In the proposed method, a cross-sectional shape of a pattern to be measured, or process parameters of the pattern are calculated by utilizing image characteristic quantities effective for estimating cross-sectional shape or process parameters of the pattern, based on a SEM image of the pattern, then saving a relationship between the image characteristic quantities and the cross-sectional shape or process parameters of the pattern beforehand in a database (the relationship is hereinafter called learning data), and collating image characteristic quantity data calculations from the SEM image of the pattern with the learning data.

Accordingly, the present invention is adapted to realize the following when learning data is created from measurement results on various patterns each previously formed into a specific cross-sectional shape or using specific process parameters. That is to say, the number of learning data samples and/or a distribution state thereof is such that during cross-sectional shape estimating or process parameter estimating, sufficient estimation accuracy can be obtained even in estimated fluctuation ranges of various parameters used for the estimating process (i.e., even in a fluctuation range of a cross-sectional shape likely to be formed because of changes in process parameters, or fluctuation ranges of process parameters likely to become effective values during the formation of the pattern).

The present invention is also adapted such that if, during cross-sectional shape estimating or process parameter estimating, the number of learning data samples and/or the distribution state thereof is judged to be inappropriate for obtaining sufficient estimation accuracy even in the estimated fluctuation ranges of the estimating parameters used, useful information will be supplied for a user to identify the pattern of a cross-sectional shape or process parameters to be subjected to additional learning.

In addition, in the present invention, when the image characteristic quantities that have been calculated from the SEM image of the semiconductor pattern are used to monitor the cross-sectional shape or the process parameters, the above-mentioned estimation accuracy is improved by selection of the image characteristic quantities and/or adjustment of weight between the image characteristic quantities. In that case, a method is provided so that while setting judgment criteria for the above selection and/or adjusting the weight, the user can judge whether the number of learning data samples and/or the distribution state thereof is such that sufficient estimation accuracy can be obtained even in the estimated fluctuation ranges of the estimating parameters used.

Furthermore, in the present invention, during selection of the optimal engine used for estimating the cross-sectional shape or the process parameters, the user can easily select the estimation engine while checking the distribution state of the learning data and the above-mentioned estimating performance against the judgment criteria for the selection.

Furthermore, in the present invention, in order to collect the learning data, the patterns formed into various cross-sectional shapes or using various process parameters are estimated. For estimation of cross-sectional shapes and process parameters, an appropriate amount of learning data and/or acquiring appropriate distribution information on the samples may not be easily acquired in order to obtain sufficient estimation accuracy even in the estimated fluctuation ranges of the estimating parameters used, in terms of semiconductor-manufacturing apparatus adjustment or creation time or the like. Even if the amount of learning data actually acquired is not sufficient, estimating results on the cross-sectional shapes or on the process parameters can be appropriately analyzed and evaluated in quantitative form by, for example, presenting reliability data via a GUI function.

(Example of a CD-SEM Apparatus)

FIG. 1A is a schematic block diagram showing a configuration of a scanning electron microscope (SEM) which acquires a secondary electron (SE) image or backscattered electron (BSE) image of a sample (semiconductor wafer) in the present invention. Hereinafter, the SE image and the BSE image are collectively called a SEM image. Also, the image acquired in this example includes part or all of a top-down image or tilt image of a circuit pattern shape to be measured, the top-down image or tilt image being obtained during observation of the circuit pattern shape from a perpendicular direction or an arbitrary tilt angle direction, respectively.

The scanning electron microscope (CD-SEM) 401 (420, 421) has an electron optical system 102 that includes: an electron gun 103 for emitting an electron beam (primary electrons) 104; a condenser lens 105 for converging the electron beam 104 emitted from the electron gun 103; a deflector 106 controlled by a deflection controller 120 and deflecting the converged electron beam 104; an objective lens 108 controlled by the deflection controller 120 and focusing on a semiconductor wafer 101 the electron beam deflected by the deflector 106 before being irradiated; an ExB deflector 107 for directing secondary electrons originated from the semiconductor wafer 101, to a secondary electron detector 109; the secondary electron detector 109 for detecting the secondary electrons originated from the semiconductor wafer 101; and backscattered electron detectors 110, 110 for directing backscattered electrons originated from the semiconductor wafer 101.

The scanning electron microscope (CD-SEM) 401 (420, 421) also has an XY stage 117 on which to rest the semiconductor wafer 101. The scanning electron microscope (CD-SEM) 401 (420, 421) further has a stage tilt function to conduct stage control by a stage controller 119. The XY stage 117 moves the semiconductor wafer 101, thus enabling an arbitrary portion of the wafer 101 to be imaged. Hereinafter, changing an observation position using the XY stage 117 is called "stage shift" and changing the observation position by deflecting the electron beam using the deflector 106 is called "beam shift."

In this way, the deflector 106 and the objective lens 108 control an irradiation position and diameter reduction (converging) of the electron beam 104 so that any position on the semiconductor wafer 101, the sample on the stage 117, is irradiated with the focused electron beam. Secondary electrons and backscattered electrons are emitted from the semiconductor wafer 101 that has been irradiated with the electron beam, and the secondary electrons are detected by the secondary electron detector 109. The backscattered electrons are detected by the backscattered electron detectors 110 and 111. The backscattered electron detectors 110 and 111 are installed in directions different from each other. The secondary electrons and backscattered electrons that have been detected by the secondary electron detector 109 and the backscattered electron detectors 110 and 111, respectively, are converted into digital signal form by A/D converters 112, 113, 114, then stored into an image memory 122 of a processor/controller 115, and subjected to appropriate image processing by a CPU 121 according to particular needs. Although two backscattered-electron image detectors, 110 and 112, are shown in the example of FIG. 1A, the number of backscattered-electron image detectors can be reduced or increased.

Figure 1B:
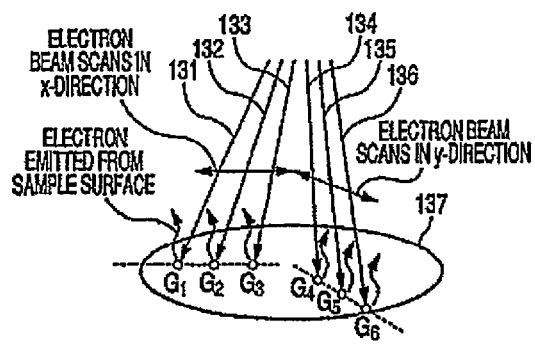
FIG. 1B is a diagram that explains irradiation of a semiconductor wafer with electron beams.
Figure 1C:
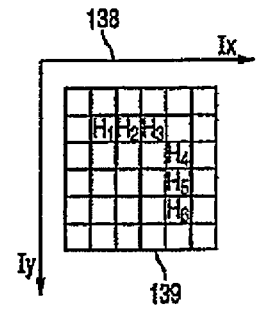
FIG. 1C is a diagram that shows pixels of an image obtained from detection of electrons emitted from the semiconductor wafer during the irradiation thereof with the electron beams.

FIGS. 1B and 1C show a method in which, when the semiconductor wafer is scanned with electron beams for irradiation, signal quantities of the electrons emitted from the semiconductor wafer are converted into images. For example, as shown in FIG. 1B, the semiconductor wafer is scanned and irradiated with electron beams 131-133 or 134-136 in an x- or y-direction, respectively. The scanning direction can be varied by changing a deflecting direction of the electron beams. Positions on the semiconductor wafer where it has been scanned and irradiated with the electron beams 131 to 133 in the x-direction are denoted as reference numbers G1 to G3, respectively. Similarly, positions on the semiconductor wafer where it has been scanned and irradiated with the electron beams 134 to 136 in the x-direction are denoted as reference numbers G4 to G6, respectively. The signal quantities of the electrons which have been emitted from the positions G1-G3 become brightness values formed by pixels H1 to H6, respectively, within an image 139 which is shown in FIG. 1C (the subscripts 1 to 6 at the lower right of symbol G are respectively associated with those of symbol H). Reference number 138 denotes a coordinate system indicating the x- and y-directions in the image.

Several methods are available to obtain a tilt SEM image of the circuit pattern shape when observed from an arbitrary tilt angle direction using the CD-SEM 401 (420, 421) shown in FIG. 1A. Examples of these methods are: (1) a scheme of acquiring a tilt image by deflecting the electron beams irradiated from the electron optical system, and thus giving a tilt angle to the irradiation of the electron beams (this scheme is described in, for example, Japanese Patent Laid-Open No. 2000-348658), (2) an imaging scheme by inclining the stage 117 itself that moves the semiconductor wafer (in FIG. 1A, the stage is inclined at an angle 218), and (3) an imaging scheme by mechanically inclining the electron optical system itself.

The processor/controller 115 shown in FIG. 1A is a computer system, which sends control signals to the stage controller 119 and the deflection controller 120 and performs various processing and control functions such as processing the observation image on the semiconductor wafer 101. The processor/controller 115 is connected to a display 116 and has a GUI (Graphic User Interface) function that display images and others to a user.

Figure 3A:
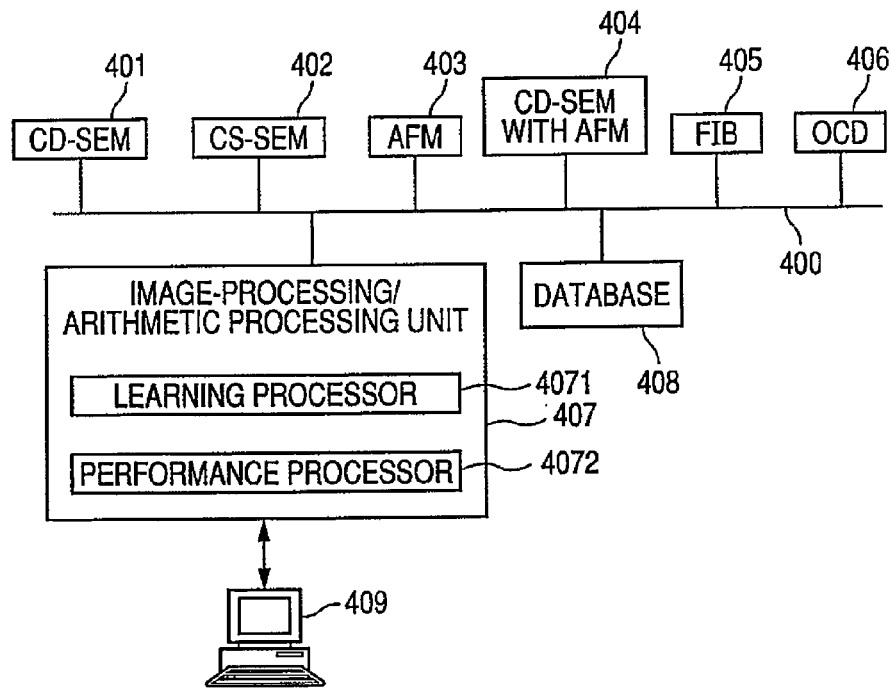
FIG. 3A is a diagram showing a system configuration in which a CD-SEM, a CS-SEM, an AFM, a CD-SEM mounted in an AFM, an FIB, or an OCD-microscope is connected to an image-processing/arithmetic processing unit through a network.
Figure 3B:
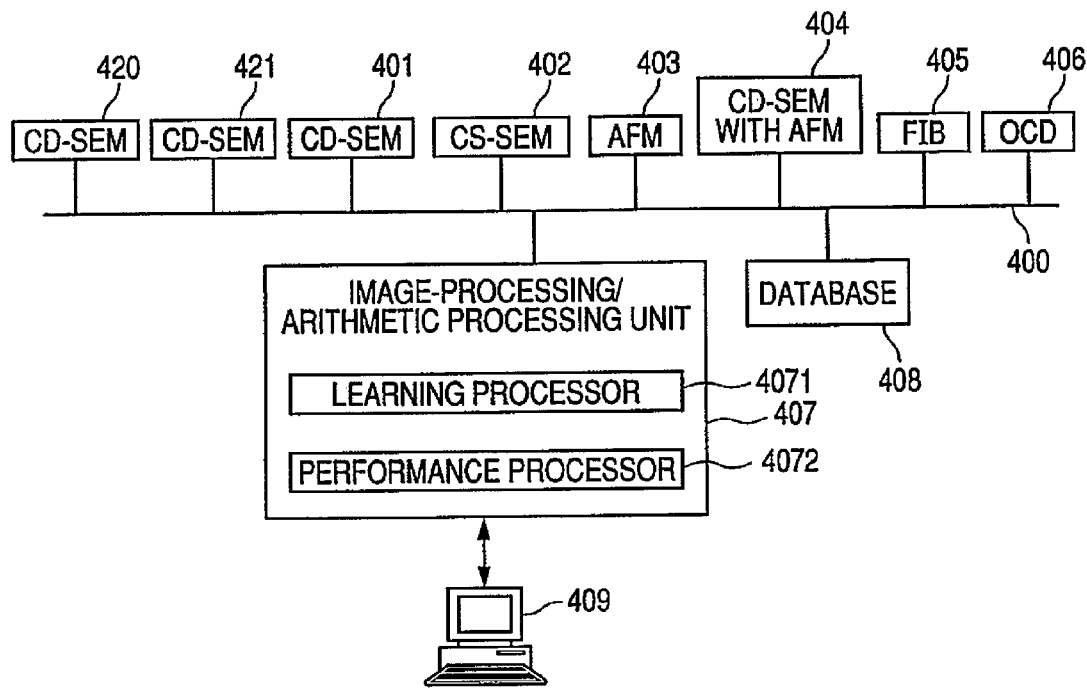
FIG. 3B is a diagram showing a system configuration having a plurality of CD-SEMS connected to a network to share a database, an image-processing/arithmetic processing unit, and other system components, among the plurality of CD-SEMS.

Part or all of the processing and control functions performed by the processor/controller 115 can also be allocated to a plurality of different processing terminals. In addition, the processor/controller 115 is connected to a network 400 as shown in FIG. 3A or 3B, and is constructed to intercommunicate with other apparatus constituent elements 402-406, 420, 421, with an image-processing/arithmetic processing unit 407 that performs the processes shown in FIG. 4, such as a learning process 300 and a performance evaluation process 350, and with a database 408.

(Examples of Semiconductor Pattern Cross-Sectional Shapes)

Typical examples of semiconductor pattern cross-sectional shapes which are subjected to estimating in the present invention are described below using FIGS. 2A to 2J. A normal cross-sectional shape of a semiconductor pattern, and abnormal cross-sectional shapes of semiconductor patterns are shown by way of example in FIGS. 2A-2J. Cross-sectional shape 200 shown in FIG. 2A is an example of the cross-sectional shape typically considered to be one of the most desirable shapes achievable in semiconductor patterns. In this example, sidewalls of the pattern are essentially perpendicular in tilt angle θ. In addition, at pattern bottom 221, the sidewalls of the pattern are essentially orthogonal to the surface of an underlayer, and at pattern top 220, a toplayer of the pattern and the sidewalls thereof are essentially orthogonal to each other.

In contrast to FIG. 2A, FIGS. 2B to 2J show cross-sectional shapes 201 to 213 that are generally classified as abnormal semiconductor pattern shapes, and these are examples of a pattern in which desired device characteristics cannot be obtained. The pattern shapes 201-213, however, may be intentionally formed to obtain desired circuit composition, as shown in FIGS. 2B-2J.

Next, each shape is briefly described below. The cross-sectional shape 201 shown in FIG. 2B is a pattern shape with pattern sidewalls inclined at angle θ smaller than 90°, and this pattern shape may be called a forward tapered shape. The cross-sectional shape 202 shown in FIG. 2C is a pattern shape with pattern sidewalls inclined at angle θ greater than 90°, and this pattern shape may be called an inverse tapered shape. The cross-sectional shape 203 shown in FIG. 2D is a pattern shape with a thin pattern central portion and inward curved sidewalls 222, and this pattern shape may be called a bowing shape. The cross-sectional shape 204 shown in FIG. 2E is a pattern shape with round upper corners 223 of the pattern. The cross-sectional shape 205 shown in FIG. 2F is a pattern shape with protuberant upper corners 223 of the pattern, and this pattern shape may be called an overhung shape. The cross-sectional shape 206 shown in FIG. 2G is a pattern shape with skirt-like portions 225 at the bottom of the pattern, and this pattern shape may be called a skirt shape. The cross-sectional shape 207 shown in FIG. 2H is a pattern shape with underlayer sidewall crossover portions 226 disposed more internally than upper sidewall portions of the pattern, and this pattern shape may be called a notched shape. The patterns 208, 209, 210, 211 shown in FIG. 2I each have a shape smaller than a desired vertical size, and each of these pattern shapes may be called a thinned-down shape. The pattern 212 shown in FIG. 2J is smaller than a desired horizontal size, and the pattern 213 shown in FIG. 2J is greater than a desired horizontal size.

The cross-sectional shapes 202-213 shown in FIGS. 2B-2J are examples of abnormal shapes caused by the inappropriate process parameters used during semiconductor manufacturing. For semiconductor circuit patterns, gate length becomes a dimension of the pattern bottom and thus it becomes important to measure the dimension of the bottom independently of the pattern shape, but during a gate-forming process, a source/drain of a transistor is formed by ion implantation through a wiring pattern. Accordingly, tilt angles of the pattern sidewalls and the shape of the pattern bottom affect treatment results on the ion implantation process, thus leading to changes in device characteristics. It is therefore important to manage the above-mentioned cross-sectional shape of the gate pattern properly. Also, during an exposure process, a pattern is thermally transferred to the surface of a resist according to exposure mask and then a developing operation based on the transferred pattern is conducted to form the resist pattern.

Next, an etching process is conducted to etch an underlayer using the formed resist pattern as a mask pattern. During the etching process, if the resist pattern has an abnormality in its cross-sectional shape, formation of an etching pattern on the underlayer is also likely to become abnormal during the etching. Hence, it is very important to evaluate the cross-sectional shape of the pattern during both the gate-forming process and the exposure process. A method of calculating the cross-sectional shape will be described later herein. The present invention is characterized in that it monitors the cross-sectional shape.

(Example of Process Parameters)

Next, a typical example of the process parameters estimated according to the present invention is described below. In the present invention, the kinds of process parameters described below include a position of focus in an exposure machine, a dose rate, an exposure time, a baking temperature, a baking time, an etching time in an etching apparatus, an internal temperature of a chamber, a gas flow rate, or a gas pressure. Also, the present invention calculates part or all of these parameters. Although the above process parameters have been enumerated as an example of the process parameters estimated, the present invention is not limited to the above process parameters and the invention is characterized in that it monitors the process parameters which require adjustment during an exposure process or an etching process.

(Examples of a Semiconductor Process-Estimating System)

Next, configurations of a semiconductor process-estimating system for evaluating and managing semiconductor wafer circuit patterns according to the present invention during semiconductor-manufacturing processes, and more particularly, system configurations for managing a cross-sectional shape and process parameters of a semiconductor pattern using a CD-SEM(s) are described below using FIGS. 3A, 3B. An embodiment of the system configuration shown in FIG. 3A is first described below. In this system configuration, part or all of the system constituent elements 401-408 described below are connected via a network 400 and can share the input information and output information used for cross-sectional shape or process parameter estimating or for calculation of various reliability data. Connected to the network 400 are: a CD-SEM 401; part or all of the group consisting of a cross-sectional SEM (CS-SEM) 402, an AFM (Atomic Force Microscope) 403, an AMF-mounted CD-SEM 404, an FIB (Focused Ion Beam) microscope 405, and an OCD (Optical Critical Dimension) microscope 406; an image-processing/arithmetic processing unit 407 inclusive of a learning processor 4071 and of a performance processor 4072 and with a connected display 409 having a GUI function; and a database 408. The CD-SEM 401 is used to acquire SEM images of pattern shapes to be measured.

The CS-SEM) 402, the AFM 403, the AMF-mounted CD-SEM 404, the FIB microscope 405, or the OCD microscope 406 are used to measure cross-sectional geometric data to be defined as correctly estimated data in the learning process steps (300) described later. The image-processing/arithmetic processing unit 407 undertakes image processing for calculation of image characteristic quantities from each SEM image, cross-sectional shape estimating or process parameter estimating, and arithmetic processing such as reliability data calculation. The database 408 is used to save the data used for cross-sectional shape estimation or process parameter estimation of the pattern shape to be measured, and for the reliability data calculation conducted together with the estimating process mentioned above. The kinds of data saved include the SEM image, cross-sectional shape estimation results, process parameters, image-processing parameters, cross-sectional shape estimation process parameters, process estimating parameters, and other information.

FIG. 3B is a diagram showing another embodiment of a system configuration in which a plurality of CD-SEMs, 401, 420, 421, are connected to a network 400 to share a database 408, an image-processing/arithmetic processing unit 407, and other elements. In this system configuration with the CD-SEMs 420 and 421 connected to the system configuration of FIG. 3A via the network 400, the same learning data as used during cross-sectional shape or process parameter estimation can be used (the learning data is a combination of SEM images and cross-sectional shape information or process parameter information associated with the SEM images). Constructing the system in this way makes it possible to efficiently estimate a cross-sectional shape and process parameters.

Figure 4:
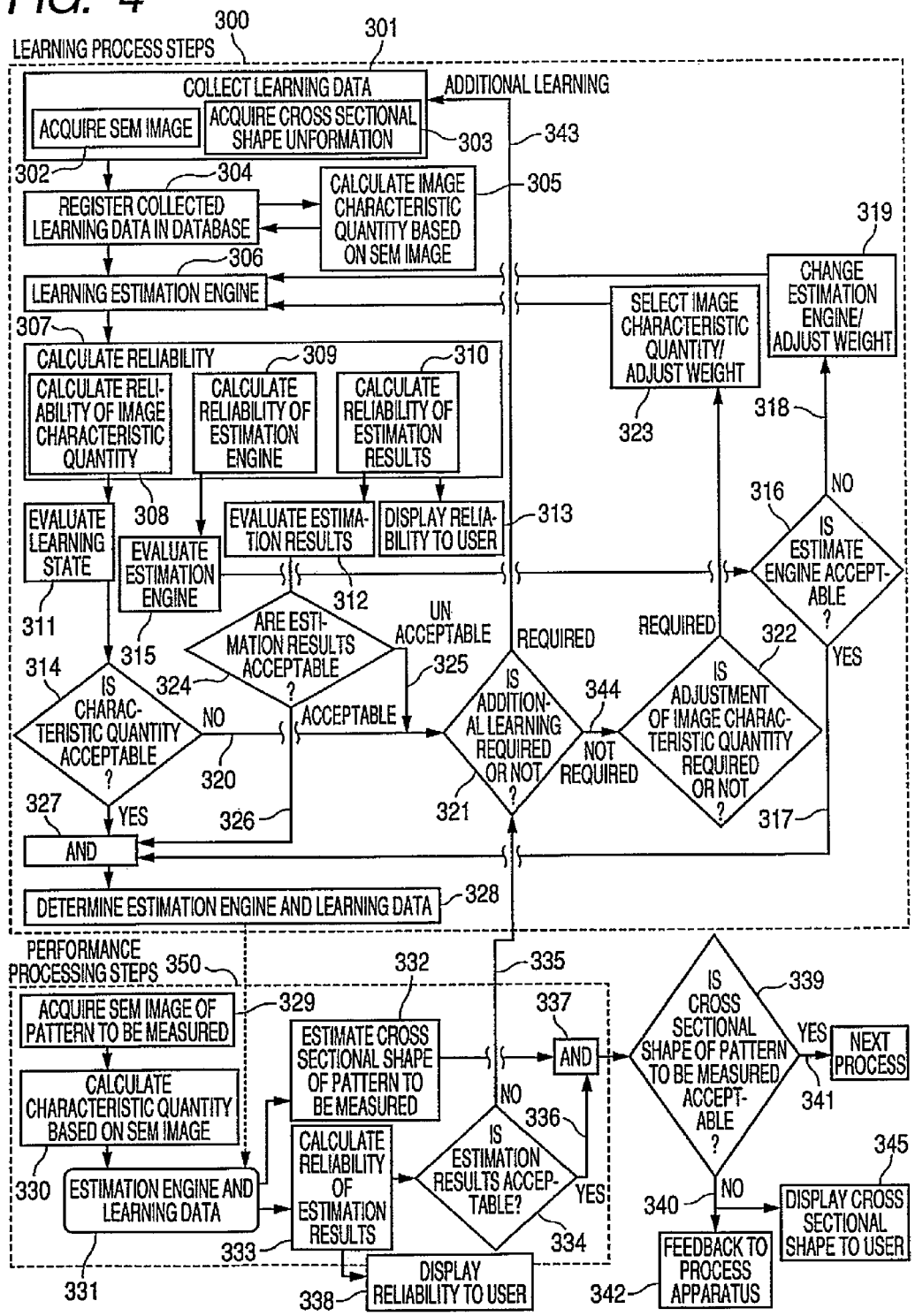
FIG. 4 is a flowchart showing a learning process step and a performance process step to estimate a cross-sectional shape.
Figure 5:
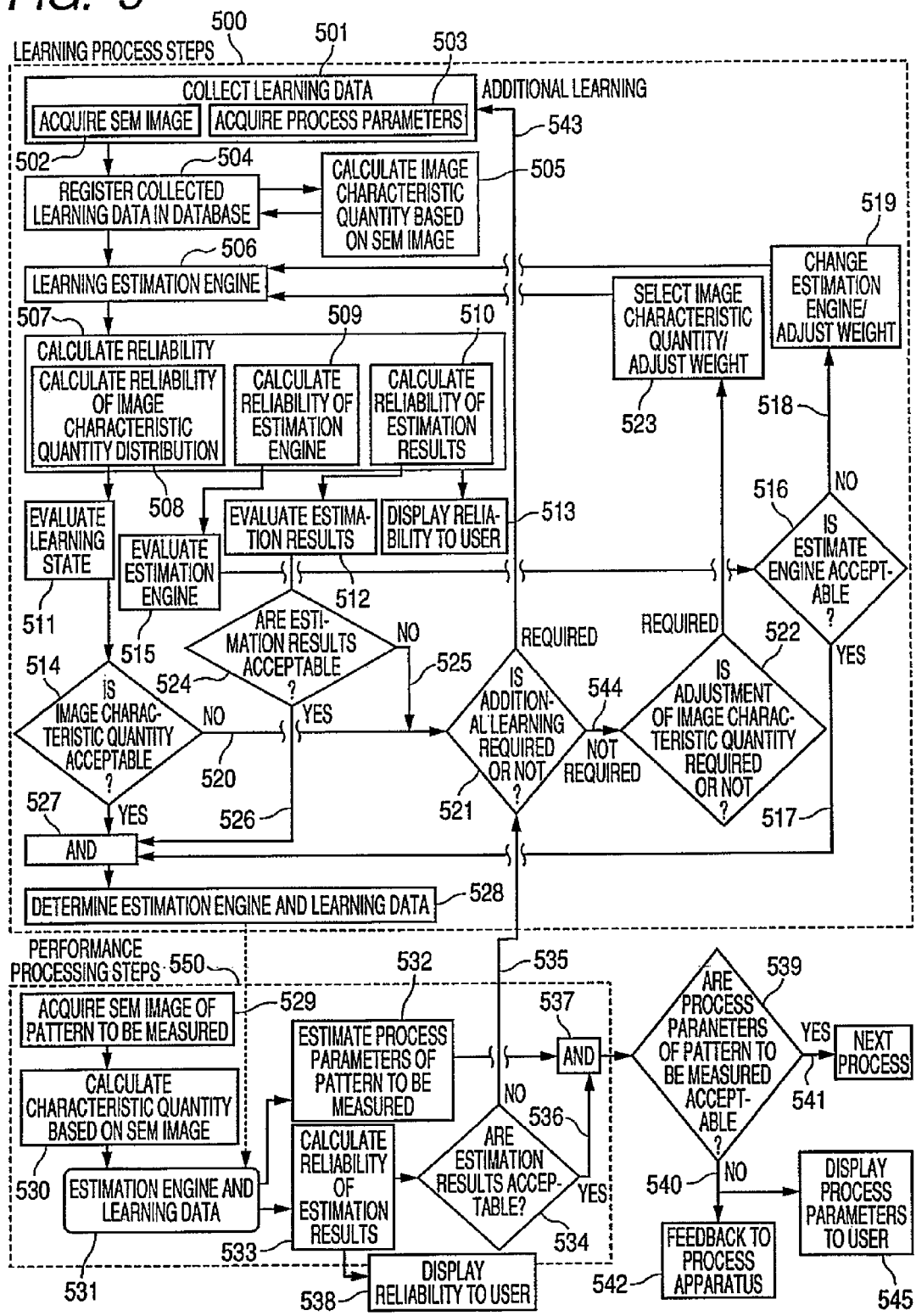
FIG. 5 is a flowchart showing a learning process step and a performance process step to estimate process parameters.

On the basis of the SEM images and cross-sectional shape information or process parameters acquired as learning data from the CD-SEM 401 and other system components, the learning processor 4071 within the image-processing/arithmetic processing unit 407 executes the learning process steps (300) and (500) shown in FIGS. 4 and 5, respectively. After that, on the basis of an estimation engine that the learning processor 4072 has determined along with the above learning data, and the SEM images acquired by the CD-SEM 401 or the like, the performance processor 4072 within the image-processing/arithmetic processing unit 407 executes the performance process steps (350) and (550) shown in FIGS. 4 and 5, respectively, and thus evaluates the cross-sectional shape or the process parameters. Instead of the performance processor 4072, an internal CPU 121 of a processor/controller 115 provided in the CD-SEM 401 (420, 421) may execute the performance process steps (350, 550).

(Example of Cross-Sectional Shape Estimating)

Next, a process flow of the semiconductor pattern cross-sectional shape estimating process and reliability calculation on cross-sectional shape estimation results, executed by, for example, the learning processor 4071 and performance processor 4072, respectively, in the present invention, is described below using FIG. 4. The estimation process is broadly divided into learning process steps (300) and performance process steps (350).

The learning process steps (300) are first described below. The learning process steps (300) consist of a learning data acquisition step (301), an image characteristic quantity selection and/or adjustment step (323), and an estimation engine selection and/or adjustment step (319). Execution of the latter two steps, 323 and 319, is based on the reliability described later herein. Acquisition of SEM images in step 302 from the semiconductor patterns of various shapes that have been created using the method described later (these created patterns are hereinafter called the learning samples), and acquisition of associated cross-sectional shape information in step 303 are conducted in the learning data acquisition step (301). The acquisition of the cross-sectional shape information in step 303 is conducted using AFM (Atomic Force Microscope) measurement, OCD (Optical Critical Dimension) measurement, cross-sectional SEM (CS-SEM) measurement, or other cross-sectional shape measuring instruments 401-406, 420, 421. Thus, cross-sectional shapes of the learning samples are measured.

Data that consists of a combination between the above-obtained SEM images and associated cross-sectional shape information of the learning samples is called learning data. In step 304, the learning data that was acquired in step 301 by the CD-SEM 401 (420, 421) and other measuring instruments 402-406 is registered in the database 408 via the network 400, for example. In step 305, the learning processor 4071 calculates the later-described image characteristic quantities from the acquired SEM images, and then back in step 304, registers the image characteristic quantities, together with the learning data, in the database 408. The image characteristic quantities, although detailed later herein, have a correlation with changes in three-dimensional shapes of the semiconductor patterns.

In step 306, the learning processor 4071 learns the later-described estimation engine by using the learning data that has been saved in the database 408 (i.e., the data consisting of a combination between the SEM images and associated cross-sectional shape information). The learning processor 4071 next executes step 307 to calculate reliability using the estimation engine that the learning processor has learned. In reliability calculation step 307, three kinds of reliability data are calculated. That is to say, reliability of an image characteristic quantity distribution is calculated in step 308, reliability of the estimation engine is calculated in step 309, and reliability of the estimation results is calculated in step 310. The three kinds of reliability data become index values for judging whether the number of learning data samples and/or the distribution thereof is appropriate for obtaining sufficient estimation accuracy in estimated fluctuation ranges of the cross-sectional shapes estimated using the estimation engine. The user can set the estimated fluctuation ranges by manually entering each range using the later-described GUI (Graphic User Interface) of the display 409 or 116 or the like, or by adopting default settings or the later-described data saved in the database.

Also, the reliability data is presented to the user via the GUI in step 313 to enable the user to understand settings of the learning data or a state of the estimation engine and to select and/or adjust the estimation engine (steps 323, 329) while confirming the reliability data. In the present invention, since, in this way, the three kinds of reliability data calculated in step 307 (i.e., the reliability of the image characteristic quantity distribution, calculated in step 308, the reliability of the estimation engine, calculated in step 309, and the reliability of the estimation results, calculated in step 310) are presented to the user via the GUI, the user can not only use the reliability data as the index data for judging whether the number of learning data samples and/or the distribution thereof is appropriate for obtaining sufficient estimation accuracy in the estimated fluctuation ranges of the cross-sectional shapes estimated using the estimation engine, but also understand the settings of the learning data or the state of the estimation engine and select and/or adjust the estimation engine while confirming the reliability data.

As will be detailed later herein, on the basis of the reliability data of the image characteristic quantity distribution that was obtained in step 308, the learning processor 4071 evaluates the learning state in step 311 and judges in step 314 whether the image characteristic quantities are appropriate for estimating the cross-sectional shape of the pattern. If it is found in step 320 that the image characteristic quantities are not appropriate, the learning processor 4071 executes step 321 to judge whether additional learning is necessary. If it is found in step 343 that additional learning is necessary, the learning processor 4071 returns to step 301 to re-acquire learning data (another combination between SEM images and associated cross-sectional shape information) from the learning samples or to add learning samples and acquire new learning data. After the judgment in step 321, if it is found in step 344 that additional learning is unnecessary, the learning processor 4071 executes step 322, as will be detailed later, to judge whether the characteristic quantities require adjustment. If the judgment results that were obtained in step 322 indicate that the adjustment of the characteristic quantities is necessary, the learning processor 4071 conducts image characteristic quantity selections and/or weight adjustments thereof in step 323 and then returns to step 306 to re-learn the estimation engine by using adjusted characteristic quantities. After this, the learning processor 4071 executes step 315 to evaluate the estimation engine on the basis of the reliability thereof that was calculated in step 309.

Next, on the basis of evaluation results on the estimation engine, the learning processor 4071 judges in step 316, during cross-sectional shape estimation, whether the estimation engine can obtain sufficient estimation accuracy in the estimated fluctuation range of the cross-sectional shape estimated. If it is found in step 318 that the estimation engine does not suffice, the learning processor 4071 executes step 319, as will be detailed later, to change the estimation engine and/or adjust the weight between engines, and then executes step 306 to learn another estimation engine obtained after the change or the weight adjustment.

Next, after executing step 310 to calculate reliability of the new estimation results obtained, the learning processor 4071 evaluates the new estimation results in step 312. After evaluating the new estimation results, the learning processor 4071 executes step 324 to conduct an acceptability judgment on the new estimation results, based on evaluation results. If it is found in step 325 that the new estimation results are not reliable enough, the learning processor 4071 executes step 321 to judge whether additional learning is necessary. If it is found in step 343 that additional learning is necessary, the learning processor 4071 returns to step 301 to re-acquire learning data from the learning samples or to add learning samples and acquire new learning data. After the judgment in step 321, if it is found in step 344 that additional learning is unnecessary, the learning processor 4071 executes step 322, as will be detailed later, to judge whether the characteristic quantities require adjustment. If the judgment results that were obtained in step 322 indicate that the adjustment of the characteristic quantities is necessary, the learning processor 4071 conducts image characteristic quantity selections and/or weight adjustments thereof in step 323 and then returns to step 306 to re-learn the estimation engine by using adjusted characteristic quantities.

When the image characteristic quantity appropriateness judgment in step 314, the estimation result acceptability judgment in step 324, and the estimation engine reliability judgment in step 316 indicate that the cross-sectional shape estimation accuracy obtained during cross-sectional shape estimating based on the estimation engine and on the learning data is high enough for obtaining sufficient estimation accuracy in the estimated fluctuation range of the cross-sectional shape estimated, if it is judged during ANDing operations (step 327) between all the above appropriateness/acceptability judgment results (in steps 314, 324, 316) that necessary conditions are satisfied, the learning processor 4071 determines the learning data and the estimation engine as learning data and estimation engine 331 to be used in the performance process steps (350) described next, and becomes ready for supplying (transmitting) the learning data and estimation engine 331 to the performance processor 4072 or the like.

Next, the performance process step (350) is described below. In the estimation steps (332, 333), the performance processor 4072 or the like calculates a cross-sectional shape of a pattern to be measured, and reliability of cross-sectional shape estimation results, by using the estimation engine and learning data (data consisting of a combination between SEM images and associated cross-sectional shape information) determined in the learning process steps (300). First, step 329 is executed to acquire a SEM image of the pattern from the CD-SEM 401 (420, 421) and then store the SEM image into the database 408, for example. The performance processor 4072 or the like calculates image characteristic quantities from the acquired SEM image in step 330. The image characteristic quantities calculated here are of the same kind as that of the image characteristic quantity data that was calculated from the SEM image in step 305 of the learning process steps (300). As will be detailed later, the performance processor 4072 or the like executes step 332 to monitor the cross-sectional shape of the pattern, and step 333 to calculate the reliability of the estimation results, from the image characteristic quantities that were calculated in step 330, and from the estimation engine and learning data 331 that were determined in step 328. Next, whether the reliability of the estimation results satisfies the threshold level required is judged in step 334 and if the reliability is judged to satisfy the threshold level, the estimated cross-sectional shape is output in step 337 as the cross-sectional shape of the pattern.

In step 339, the image-processing/arithmetic processing unit 407 evaluates the cross-sectional shape that has been output from the performance processor 4072, for example, and examines whether the cross-sectional shape is a desired one. If, in step 341, the pattern shape is found to satisfy design standards, an associated signal is transmitted from the image-processing/arithmetic processing unit 407 via the network 400 to a process management apparatus (not shown) that is managing the semiconductor-manufacturing line, and the pattern is sent to next process site. If, in step 340, the pattern shape is found not to satisfy the design standards, the image-processing/arithmetic processing unit 407 outputs a control signal to a process apparatus (e.g., the exposure machine 702 or etching apparatus 704 shown in FIG. 7) via the network 400 to indicate that the pattern needs to be fed back to an associated process site, and the image-processing/arithmetic processing unit 407 feeds back the pattern to the associated process site in step 342. As a result, process parameters (exposure parameters or etching parameters) are adjusted in the process apparatus (e.g., the exposure machine 702 or the etching apparatus 704) and then a pattern satisfying the design standards is formed. When the estimated cross-sectional shape is output from the performance processor 4072, it can also be output to, for example, a GUI screen of the display 409 for presentation to the user, in step 345. In addition, although it has been described that the evaluation of the cross-sectional shape in step 339 is conducted in the image-processing/arithmetic processing unit 407, this evaluation step may be executed in the process apparatus (e.g., the exposure machine 702 or the etching apparatus 704) and if the design standards are not satisfied in step 340, the process parameters (exposure parameters or etching parameters) may be adjusted in the process apparatus mentioned above. Furthermore, in step 345, the estimated cross-sectional shape can be presented to a display (not shown) that is connected to each process device.

If the acceptability judgment of the reliability of the estimation results in step 330 of the performance process steps (350) indicates that the cross-sectional shape estimation results are found to be insufficient, the learning processor 4071 executes step 321 in the learning process steps (300) to judge whether additional learning is necessary for re-learning. If it is found in step 343 that additional learning is necessary, the learning processor 4071 returns to step 301 to re-acquire learning data from the learning samples or to add learning samples and acquire new learning data. After the judgment in step 321, if it is found in step 344 that additional learning is unnecessary, the learning processor 4071 executes step 322, as will be detailed later, to judge whether the image characteristic quantities require adjustment. If the adjustment of the image characteristic quantities is necessary, the learning processor 4071 conducts image characteristic quantity selections and/or weight adjustments thereof in step 323 and then returns to step 306 to re-learn the estimation engine by using adjusted image characteristic quantities.

The present invention is characterized particularly in that part or all of the various reliability data calculated in steps 308, 309, 310 during the execution of the reliability calculation step (307) within the learning process steps (300) is presented from, for example, the GUI of the display 409 to the user in step 313.

The present invention is characterized in that the reliability of the pattern cross-sectional shape estimation results that was calculated in the estimation result reliability calculation step (333) of the performance process steps (350) is also presented from, for example, the GUI of the display 409 to the user in step 338. Since the reliability of the pattern cross-sectional shape estimation results that was thus calculated in step 333 is presented to the user, it becomes possible for the user to perform more appropriate judgments on the estimation results.

Using various reliability data in the learning process steps (300) of the semiconductor pattern cross-sectional shape estimating technique of the learning type in accordance with the process flow described above makes it possible to judge, during estimating of a cross-sectional shape, whether sufficient learning data has been acquired for obtaining sufficient estimation accuracy in the estimated fluctuation range of the cross-sectional shape estimated.

In the performance process steps (350), the reliability of the pattern shape estimation results that was obtained in step 338 can also be calculated, and the user can perform more appropriate judgments on the estimation results, based on the calculated reliability.

(Example of Process Parameter Estimating)

Next, a process flow of the semiconductor pattern process parameter estimation process and reliability calculation on process parameter estimation results, executed by, for example, the learning processor 4071 and performance processor 4072, respectively, in the present invention, is described below using FIG. 5. The estimation process is broadly divided into learning process steps (500) and performance process steps (550).

The learning process steps (500) are first described below. The learning process steps (500) consist of a learning data acquisition step (501), an image characteristic quantity selection and/or adjustment step (523), and an estimation engine selection and/or adjustment step (519). Execution of the latter two steps, 523 and 519, is based on the reliability described later herein. Acquisition of SEM images in step 502 and acquisition of associated cross-sectional shape information in step 503 are conducted in the learning data acquisition step (501). In step 502, SEM images are acquired from semiconductor patterns that have been created using the later-described method and formed using process parameters assigned to a process apparatus, for example, the exposure machine 702 or etching apparatus 704 shown in FIG. 7 (these semiconductor patterns are hereinafter called learning samples). Cross-sectional shape information associated with the SEM images is acquired in step 503. In order to acquire the cross-sectional shape information in step 503, patterns on FEM (Focus Exposure Matrix) wafers are measured using various exposure parameters assigned to the exposure machine 702, for example, and a combination of the SEM images and process parameters acquired during the measurements is obtained as a learning sample.

Data that consists of the combination between the above-obtained SEM images and associated cross-sectional shape information is called learning data. In step 504, the learning data that was acquired in step 501 by the CD-SEM 401 (420, 421) is registered in the database 408 via the network 400, for example. In step 505, the learning processor 4071 calculates the later-described image characteristic quantities from the acquired SEM images, and then back in step 504, registers the image characteristic quantities, together with the learning data, in the database 408. The image characteristic quantities, although detailed later herein, have a correlation with changes in three-dimensional shapes of the semiconductor patterns. In step 506, the learning processor 4071 learns the later-described estimation engine by using the learning data that has been saved in the database 408.

Next, the learning processor 4071 executes step 507 to calculate reliability using the estimation engine that the learning processor has learnt. In reliability calculation step 507, three kinds of reliability data are calculated. That is to say, reliability of an image characteristic quantity distribution is calculated in step 508, reliability of the estimation engine is calculated in step 509, and reliability of the estimation results is calculated in step 510. The three kinds of reliability data become index values for judging whether the number of learning data samples and/or the distribution thereof is appropriate for obtaining sufficient estimation accuracy in estimated fluctuation ranges of the cross-sectional shapes estimated using the estimation engine. The user can set the estimated fluctuation ranges by manually entering each range using the later-described GUI (Graphic User Interface) of the display 409 or 116 or the like, or by adopting default settings or the later-described data saved in the database.

Also, the reliability data is presented to the user via the GUI in step 513 to enable the user to understand settings of the learning data or a state of the estimation engine and to select and/or adjust the estimation engine (steps 523, 519) while confirming the reliability data. In the present invention, since, in this way, the three kinds of reliability data calculated in step 507 (i.e., the reliability of the image characteristic quantity distribution, calculated in step 508, the reliability of the estimation engine, calculated in step 509, and the reliability of the estimation results, calculated in step 510) are presented to the user via the GUI, the user can not only use the reliability data as the index data for judging whether the number of learning data samples and/or the distribution thereof is appropriate for obtaining sufficient estimation accuracy in the estimated fluctuation ranges of the cross-sectional shapes estimated using the estimation engine, but also understand the settings of the learning data or the state of the estimation engine and select and/or adjust the estimation engine while confirming the reliability data.

As will be detailed later herein, on the basis of the reliability data of the image characteristic quantity distribution that was obtained in step 508, the learning processor 4071 evaluates the learning state in step 511 and judges in step 514 whether the image characteristic quantities are appropriate for estimating the cross-sectional shape of the pattern. If it is found in step 520 that the image characteristic quantities are not appropriate, the learning processor 4071 executes step 521 to judge whether additional learning is necessary. If it is found in step 543 that additional learning is necessary, the learning processor 4071 returns to step 501 to re-acquire learning data (another combination between SEM images and associated cross-sectional shape information) from the learning samples or to add learning samples and acquire new learning data. After the judgment in step 521, if it is found in step 544 that additional learning is unnecessary, the learning processor 4071 executes step 522, as will be detailed later, to judge whether the image characteristic quantities require adjustment. If the judgment results that were obtained in step 522 indicate that the adjustment of the image characteristic quantities is necessary, the learning processor 4071 conducts image characteristic quantity selections and/or weight adjustments thereof in step 523 and then returns to step 506 to re-learn the estimation engine by using adjusted image characteristic quantities.

After this, the learning processor 4071 executes step 515 to evaluate the estimation engine on the basis of the reliability thereof that was calculated in step 509. Next, on the basis of evaluation results on the estimation engine, the learning processor 4071 judges in step 516, during cross-sectional shape estimation, whether the estimation engine can obtain sufficient estimation accuracy in the estimated fluctuation range of the cross-sectional shape estimated. If it is found in step 518 that the estimation engine does not suffice, the learning processor 4071 executes step 519, as will be detailed later, to change the estimation engine and/or adjust the weight between engines, and then executes step 506 to learn another estimation engine obtained after the change or the weight adjustment. Next after executing step 510 to calculate reliability of the new estimation results obtained, the learning processor 4071 evaluates the new estimation results in step 512. After evaluating the new estimation results, the learning processor 4071 executes step 524 to conduct an acceptability judgment on the new estimation results, based on evaluation results. If it is found in step 525 that the new estimation results are not reliable enough, the learning processor 4071 executes step 521 to judge whether additional learning is necessary. If it is found in step 543 that additional learning is necessary, the learning processor 4071 returns to step 501 to re-acquire learning data from the learning samples or to add learning samples and acquire new learning data.

After the judgment in step 521, if it is found in step 544 that additional learning is unnecessary, the learning processor 4071 executes step 522, as will be detailed later, to judge whether the image characteristic quantities require adjustment. If the judgment results that were obtained in step 522 indicate that the adjustment of the image characteristic quantities is necessary, the learning processor 4071 conducts image characteristic quantity selections and/or weight adjustments thereof in step 523 and then returns to step 306 to re-learn the estimation engine by using adjusted image characteristic quantities.

When the image characteristic quantity appropriateness judgment in step 514, the estimation result acceptability judgment in step 524, and the estimation engine reliability judgment in step 516 indicate that the cross-sectional shape estimation accuracy obtained during cross-sectional shape estimating based on the estimation engine and on the learning data is high enough for obtaining sufficient estimation accuracy in the estimated fluctuation range of the cross-sectional shape estimated, if it is judged during ANDing operations (step 527) between all the above appropriateness/acceptability judgment results (in steps 514, 524, 516) that necessary conditions are satisfied, the learning processor 4071 determines the learning data and the estimation engine as learning data and estimation engine 531 to be used in the performance process steps (550) described next, and becomes ready for supplying (transmitting) the learning data and estimation engine 531 to the performance processor 4072 or the like.

Next, the performance process step (550) is described below. In the estimating steps (532, 533), the performance processor 4072 calculates process parameters for a pattern to be measured, and reliability of process parameters estimation results, by using the estimation engine and learning data that were determined in the learning process steps (500). First, step 529 is executed to acquire a SEM image of the pattern from the CD-SEM 401 (420, 421) and then store the SEM image into the database 408, for example. The performance processor 4072 or the like calculates image characteristic quantities from the acquired SEM image in step 530. The image characteristic quantities calculated here are of the same kind as that of the image characteristic quantity data that was calculated from the SEM image in step 505 of the learning process steps (500). As will be detailed later, the performance processor 4072 or the like executes step 532 to estimate process parameters for a pattern to be measured, and step 533 to calculate the reliability of the estimation results, from the image characteristic quantities that were calculated in step 530, and from the estimation engine and learning data 531 that were determined in step 528. Next, whether the reliability of the estimation results satisfies the threshold level required is judged in step 534 and if the reliability is judged to satisfy the threshold level, the estimated process parameters are output in step 537 as the process parameters of the pattern to be measured.

In step 539, the image-processing/arithmetic processing unit 407 evaluates the process parameters that has been output from the performance processor 4072, for example, and examines whether the cross-sectional shape is a desired one. If, in step 541, the pattern shape is found to satisfy design standards, an associated signal is transmitted from the image-processing/arithmetic processing unit 407 via the network 400 to a process management apparatus (not shown) that is managing the semiconductor-manufacturing line, and the pattern is sent to next process site. If, in step 540, the pattern shape is found not to satisfy the design standards, the image-processing/arithmetic processing unit 407 outputs a control signal to the process apparatus (e.g., the exposure machine 702 or etching apparatus 704 shown in FIG. 7) via the network 400 to indicate that the pattern needs to be fed back to an associated process site, and the image-processing/arithmetic processing unit 407 feeds back the pattern to the associated process site in step 542. As a result, process parameters (exposure parameters or etching parameters) are adjusted in the process apparatus (e.g., the exposure machine 702 or the etching apparatus 704) and then a pattern satisfying the design standards is formed. When the estimated cross-sectional shape is output from the performance processor 4072, it can also be output to, for example, a GUI screen of the display 409 for presentation to the user, in step 545. In addition, although it has been described that the evaluation of the process parameters in step 539 is conducted in the image-processing/arithmetic processing unit 407, this evaluation step may be executed in the process apparatus (e.g., the exposure machine 702 or the etching apparatus 704) and if the design standards are not satisfied in step 540, the process parameters (exposure parameters or etching parameters) may be adjusted in the process apparatus mentioned above. Furthermore, in step 545, the estimated process parameters can be presented to a display (not shown) that is connected to each process device.

If the acceptability judgment of the reliability of the estimation results in step 534 of the performance process step (550) indicates that the process parameters estimation results are found to be insufficient, the learning processor 4071 executes step 521 in the learning process step (500) to judge whether additional learning is necessary for re-learning. If it is found in step 543 that additional learning is necessary, the learning processor 4071 returns to step 501 to re-acquire learning data from the learning samples or to add learning samples and acquire new learning data. After the judgment in step 521, if it is found in step 544 that additional learning is unnecessary, the learning processor 4071 executes step 522, as will be detailed later, to judge whether the image characteristic quantities require adjustment. If the adjustment of the image characteristic quantities is necessary, the learning processor 4071 conducts image characteristic quantity selections and/or weight adjustments thereof in step 523 and then returns to step 506 to re-learn the estimation engine by using adjusted image characteristic quantities.

The present invention is characterized particularly in that part or all of the various reliability data calculated in steps 508, 509, 510 of the learning process step (500) is presented from, for example, the GUI of the display 409 to the user in step 523.

The present invention is characterized in that the reliability of the pattern cross-sectional shape estimation results that was calculated in the estimation result reliability calculation step (533) of the performance process steps (550) is also presented from, for example, the GUI of the display 409 to the user in step 538. Since the reliability of the pattern cross-sectional shape estimation results that was thus calculated in step 533 is presented to the user, it becomes possible for the user to perform more appropriate judgments on the estimation results.

Using various reliability data in the learning process step (500) of the semiconductor pattern cross-sectional shape estimating technique of the learning type in accordance with the process flow described above makes it possible to judge whether sufficient learning data has been acquired for obtaining the process parameter estimation accuracy required.

In the performance process step (550), the reliability of the pattern shape estimation results that was obtained in step 538 can also be calculated, and the user can perform more appropriate judgments on the estimation results, based on the calculated reliability.

(Simultaneous Calculation of a Cross-Sectional Shape and Process Parameters)

Figure 6:
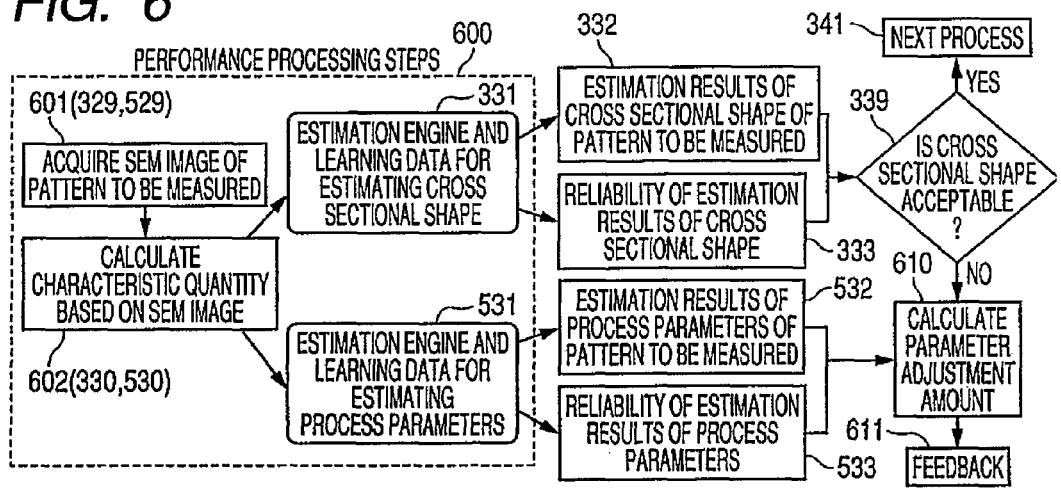
FIG. 6 is a flowchart showing a process flow of a method of calculating cross-sectional shapes and process parameters at the same time.

Next, a method of estimating a cross-sectional shape and process parameters of a semiconductor pattern simultaneously in the present invention to detect a possible abnormality of the semiconductor pattern in cross-sectional shape and undertake appropriate countermeasures against the abnormality will be described below using FIG. 6. The cross-sectional shape and the process parameters are estimated using the same methods as those described in FIGS. 4 and 5, that is, the learning type of technique.

For example, the learning processor 4071 of the image-processing/arithmetic processing unit 407 predetermines, and pre-registers in the database 408, an estimation engine and learning data 311 for cross-sectional shape estimation, and an estimation engine and learning data 531 for process parameter estimation, in the learning process steps (300) and (500).

Next, in performance process step (600), a SEM image of a pattern to be measured is acquired from the CD-SEM 401 (420, 421) and then in step 601 (329, 529), the SEM image is stored into the database 408, for example. The performance processor 4072 then calculates image characteristic quantities from the acquired SEM image of the pattern in step 602 (330, 530). After this, the performance processor 4072 calculates pattern cross-sectional shape estimation results 332, cross-sectional shape estimation result reliability 333, pattern process parameter estimation results 532, and process parameter estimation result reliability 533, from the above-registered estimation engines and learning data (311, 531). Next, the image-processing/arithmetic processing unit 407, for example, uses the calculated pattern cross-sectional shape estimation results 332 and cross-sectional shape estimation result reliability 333 to execute pattern cross-sectional shape evaluation step 339 described below.

Pattern cross-sectional shape evaluation step 339 is conducted to judge whether the pattern cross-sectional shape estimation results 332 satisfy design standards and whether the cross-sectional shape estimation result reliability 333 are equal to or greater than the foregoing threshold level and the estimation results are reliable enough. If cross-sectional shape evaluation results on the pattern satisfy the conditions described later, the image-processing/arithmetic processing unit 407, for example, transmits an appropriate signal to a process management apparatus (not shown), which then conducts management for the pattern to be transferred to a next process site in step 341. Next, if the cross-sectional shape evaluation results on the pattern do not satisfy the design standards, the image-processing/arithmetic processing unit 407, for example, executes step 610, as will be detailed later, to calculate parameter adjustment data of the process apparatus (e.g., the exposure machine 702 or the etching apparatus 704) from the pattern process parameter estimation results 532 that were calculated together with the above evaluation results. If the process parameter estimation result reliability 533 is judged to be equal to or greater than a threshold level and the pattern process parameter estimation results are judged to be reliable enough, step 611 is executed to feed back the data to the process in which the pattern was formed (e.g., mask design process 701, exposure process 702, or etching process 704).

As described above, since the process parameters with which the semiconductor pattern was formed are estimated simultaneously with the cross-sectional shape of the pattern, if the cross-sectional shape is evaluated and does not satisfy the design standards (i.e., if an abnormality is detected), feedback of the adjustment data to the process becomes possible by calculating the data from the process parameter estimation results 532.

(Example of Process Management)

Figure 7:
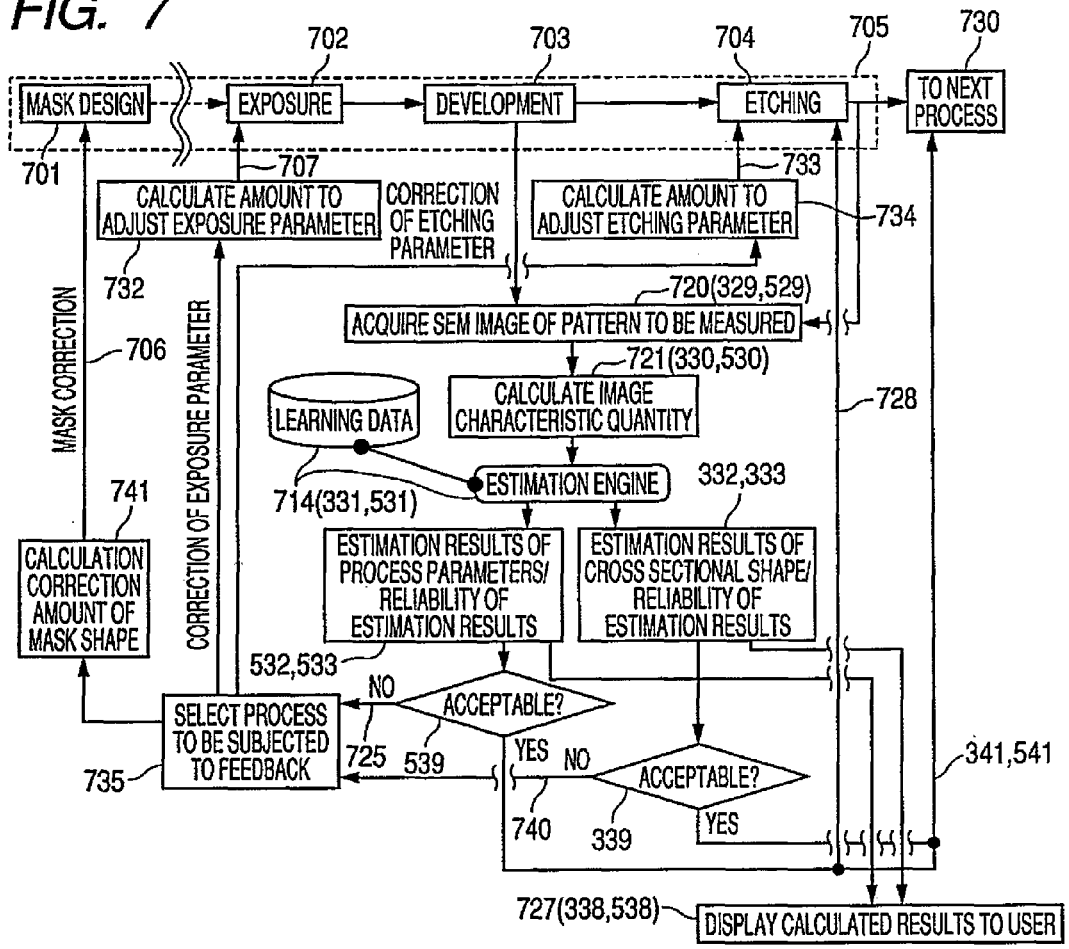
FIG. 7 is a flowchart showing a process flow of manufacturing process management.

Next, a method of semiconductor-manufacturing process monitoring (management) based on cross-sectional shape estimation of semiconductor patterns and on reliability of cross-sectional shape estimation results, and more particularly, a process flow of feedback to a process will be described below using FIG. 7. As described in FIGS. 4 and 5, a cross-sectional shape or process parameters of a pattern to be measured can be calculated from a SEM image of the pattern. Although calculation results on the cross-sectional shape of the pattern can be presented to the user through the GUI described later, a description will be given below of an example of automatic process management using the calculated cross-sectional shape information and process parameters of the pattern. FIG. 7 is an explanatory diagram of the process flow of semiconductor process management according to the present invention, showing an example of the process flow of monitoring the cross-sectional shape or process parameters of the pattern formed in an exposure process or etching process.

A section surrounded with a broken line in FIG. 7 denotes a flow of semiconductor processes. A circuit pattern is formed by designing an exposure mask (step 701), providing exposure from an exposure machine using the designed exposure mask (step 702), conducting development with a developing apparatus to form a resist pattern (step 703), and using the formed resist pattern to conduct etching with an etcher (step 704). A SEM image of the resist pattern that has been formed after the development (step 703), or of a gate pattern that has been formed after the etching operation (step 704), is acquired using the CD-SEM 401 (420, 421), and then in step 720 (329, 529), the SEM image is stored into, for example, the database 408. The image-processing/arithmetic processing unit 407 calculates image characteristic quantities (described later) from the acquired SEM image in step 721 (330, 530). Next on the basis of the calculated image characteristic quantities and the learning data and estimation engine that were registered in the database 408 in step 714 (331, 531), the image-processing/arithmetic processing unit 407 estimates a cross-sectional shape of the resist pattern or gate pattern and calculates reliability of estimation results, in steps 332 and 333, respectively. Alternatively, the image-processing/arithmetic processing unit 407 estimates the process parameters with which the resist pattern or the gate pattern was formed (e.g., exposure mask design parameters, exposure and development parameters, or etching parameters), and calculates reliability of process parameter estimation results, in steps 332 and 333, respectively. The image-processing/arithmetic processing unit 407, for example, executes steps 339, 539 to judge whether the calculated cross-sectional shape estimation results or process parameter estimation results stay within a desired design standard range and whether respective reliability data calculations 332, 333 are up to or above the foregoing threshold level and/or satisfy other necessary conditions. If it is found in steps 341, 541 that the conditions are satisfied, the image-processing/arithmetic processing unit 407, for example, transmits an appropriate signal to a process management apparatus (not shown), which then conducts management for the pattern to be transferred to a next process site in step 730.

Also, if it is found in step 740 that the cross-sectional shape estimation results fall outside the standard range and that associated reliability is equal to or above the threshold level, the image-processing/arithmetic processing unit 407, for example, selects a feedback destination process site in step 735. After this, the image-processing/arithmetic processing unit 407, for example, calculates exposure parameter adjustment data of the exposure machine in step 732 and feeds back the calculated exposure parameter adjustment data to the exposure process site 702 of the exposure machine via the network 400 in step 707, or calculates etching parameter adjustment data of the etcher in step 734 and feeds back the calculated etching parameter adjustment data to the etching process site 704 of the etcher via the network 400 in 733, or calculates mask design data correction data of a mask design apparatus in step 741 and feeds back the calculated mask design data correction data to the mask design process site 701 of the mask design apparatus via the network 400 in step 706.

Additionally, if it is found in step 725 that the process parameter estimation results fall outside the standard range and that associated reliability is equal to or above the threshold level, the image-processing/arithmetic processing unit 407, for example, selects a feedback destination process site in step 735. After this, the image-processing/arithmetic processing unit 407, for example, calculates exposure parameter adjustment data of the exposure machine in step 732 and feeds back the calculated exposure parameter adjustment data to the exposure process site 702 of the exposure machine via the network 400 in step 707, or calculates etching parameter adjustment data of the etcher in step 734 and feeds back the calculated etching parameter adjustment data to the etching process site 704 of the etcher via the network 400 in 733, or calculates mask design data correction data of a mask design apparatus in step 741 and feeds back the calculated mask design data correction data to the mask design process site 701 of the mask design apparatus via the network 400 in step 706.

The calculation of the exposure parameter adjustment data in step 732, the calculation of the etching parameter adjustment data in step 734, and the calculation of the mask shape correction data in step 741 may be conducted at the process apparatus side through access to the database 408.

Thus, the cross-sectional shape or process parameters of the pattern can be estimated or monitored in the exposure process or the etching process, respectively. The procedure laid down above relates to an example of a process management system based on estimating the cross-sectional shape or process parameters of the pattern from the SEM image thereof. This system configuration enables the process management using the cross-sectional shape information of the formed pattern, such process management being a technique that has not been traditionally achievable.

(Cross-Sectional Shape Information)

Figure 8A:
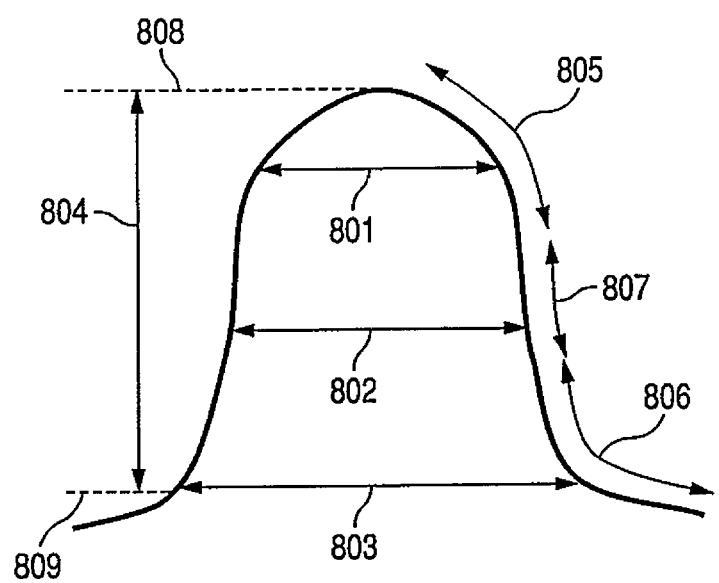
FIG. 8A is a diagram showing a section estimated to acquire cross-sectional shape information on a line pattern.
Figure 8B:
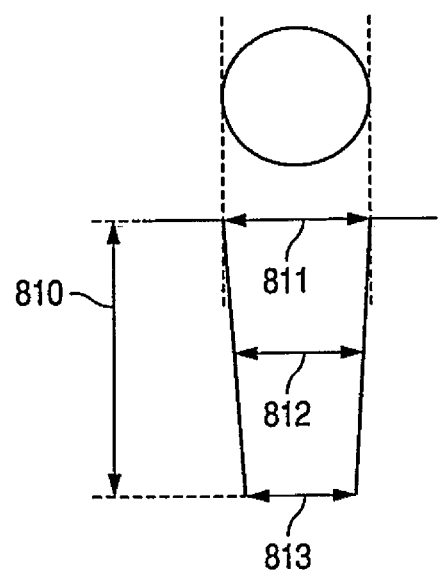
FIG. 8B is a diagram showing a section estimated to acquire cross-sectional shape information on a hole pattern.

Next, details of the information obtained during cross-sectional shape estimation of semiconductor patterns in the present invention are described below using FIGS. 8A and 8B. As shown in FIG. 8A, estimated items on a line pattern are, for example, pattern height 804 from portion 809 to portion 808, TOP-CD 801, Middle-CD 802, and Bottom-CD 803 that are line width information, a quantitative value 805 indicative of a round corner shape, a quantitative value 806 indicative of a skirt shape, and a quantitative value 807 indicative of a pattern sidewall shape. It becomes possible, by enabling these items to be estimated, to measure various shapes of patterns such as the normal pattern in FIG. 2A, the forward tapered pattern in FIG. 2B, the inverse tapered pattern in FIG. 2C, the bowing pattern in FIG. 2D, the top-rounding pattern in FIG. 2E, the overhung pattern in FIG. 2F, the skirt-like pattern in FIG. 2G, and the notched pattern in FIG. 2H. As shown in FIG. 8B, estimated items on a hole pattern are, for example, hole diameter 811 of an upper portion of the hole, hole diameter 812 of a central portion of the hole, hole diameter 813 at the bottom of the hole, and hole diameter in an arbitrary vertical position of the hole, or depth of the hole, or other dimensions. Reference number 810 denotes the depth of the hole. According to the present invention, cross-sectional shapes of other various patterns formed during semiconductor-manufacturing processes can also be measured.

(Image Characteristic Quantities)

The image characteristic quantities used in the present invention have a correlation with three-dimensional geometric changes in pattern, and part or all of the image characteristic quantities discussed in Japanese Patent Application No. 2005-320319. The above-mentioned image characteristic quantities include MPPC (Multiple Parameters Profile Characterization) image characteristic quantities, tilt MPPC image characteristic quantities, differential tilt MPPC image characteristic quantities, image characteristic quantities based on textural information, and image characteristic quantities based on line profile analysis. The image characteristic quantities that can be used in the present invention, however, are not limited to the above and the invention makes it possible to select image characteristic quantities applicable to estimating the cross-sectional shapes or process parameters described above.

Figure 9A:
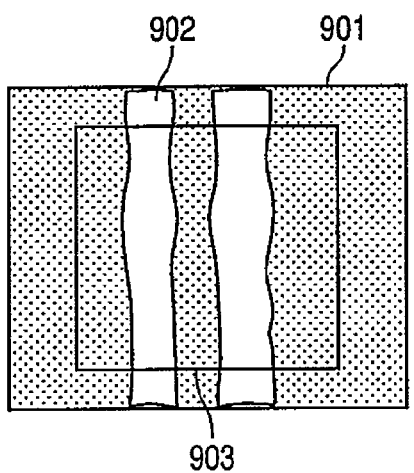
FIG. 9A is a diagram showing an image characteristic quantity calculation range extracted from a SEM image in order to calculate image characteristic quantities.
Figure 9B:
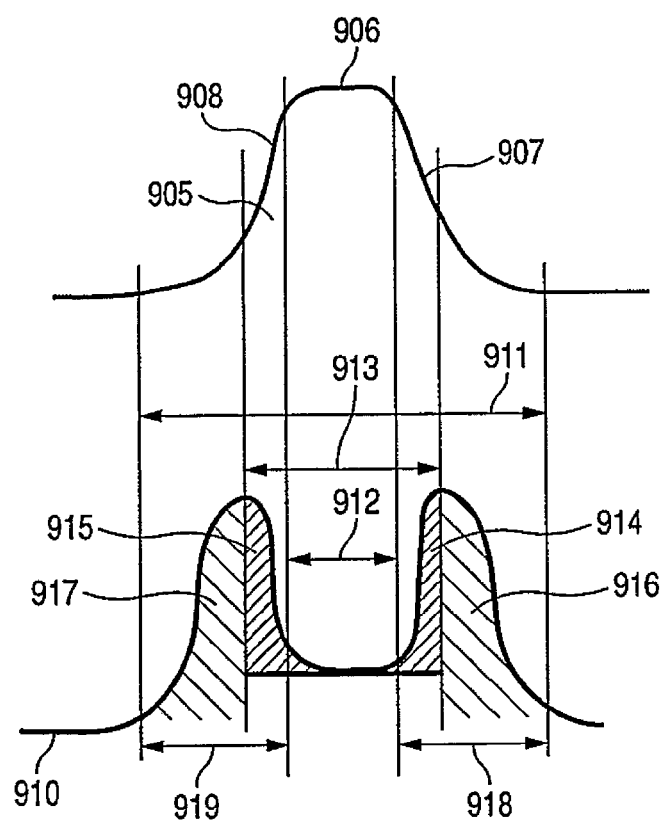
FIG. 9B is a diagram showing a line profile of the extracted image characteristic quantity calculation range.

A description based on FIGS. 9A and 9B is given below of an example of a method in which the image-processing/arithmetic processing unit 407, for example, executes steps (305, 505; 330, 530) to calculate image characteristic quantities indicative of the pattern cross-sectional shape or process parameters or of device characteristics or the like, from the SEM image of a learning sample or a pattern to be measured, acquired from the CD-SEM 401 (420, 421) or the like. An image characteristic quantities calculation range 903 is extracted from the SEM image 901 of the learning sample or to-be-measured pattern, shown in FIG. 9A. Next, the line profile 904 shown in FIG. 9B is created and various image characteristic quantities effective for calculating the cross-sectional shape of the pattern are calculated from the created line profile.

Next, a detailed process flow of the calculation is described below. First as shown in FIG. 9A, the image characteristic quantities calculation range 903 required for the creation of the line profile is specified in the SEM image 901. For example, if the pattern (902) is a line pattern extending in Y-axially (in a vertical direction of the drawing) across a field of view of the SEM image, the image characteristic quantities calculation range 903 is a range in which at least sections for calculating the image characteristic quantities are all encompassed X-axially (in a horizontal direction of the drawing). This range also contains the number of pixels (primary-electron scan lines) required to average pixel values of X-coordinates in the Y axial direction in order to reduce noises due to the SEM image. For example, if the line pattern 902 extending in a Y-direction is the pattern to be measured, an image range containing a plurality of pixels (e.g., 100 pixels) is selected on the SEM image 901 shown in FIG. 9A. At this time, characteristic noise components of the SEM image can be reduced if the number of pixels used for pixel data averaging is large enough. The selection range in the Y-direction can be changed, as appropriate, according to the shape of the pattern measured.

Next, the pixel data (signal strength value) of the X-coordinates is averaged Y-axially in the selected pixel range and thus an X-axial line profile is created. Execution of processing in up to this process step creates the line profile (910) in the image characteristic quantities calculation range 903 of the pattern. Next, image characteristic quantities corresponding to various dimension information such as line width of the pattern and edge width thereof are calculated from the above-created line profile (910). Upper and lower graphs in FIG. 9B show a relationship between the cross-sectional shape (905) and the line profile (910). The line profile (910) represents the secondary electron strength obtained from the SEM image. In general, the secondary electron strength increases according to a tilt angle of the pattern measured, so the signal strength at sidewalls 907, 908 of the pattern increases above that of a planar section 906. Band-like linear sections formed by increases in the secondary electron strength at the sidewalls and/or other portions of the pattern are called white bands. The various image characteristic quantities shown in the lower graph of FIG. 9B are calculated as the image characteristic quantities indicating the pattern cross-sectional shape of the pattern.

That is to say, bottom width 911 of the pattern, as one of the various image characteristic quantities mentioned above, indicates a tendency for the cross-sectional shape of the line pattern to change in width at a bottom section, top width 912 of the pattern, as another image characteristic quantity, indicates a tendency for the cross-sectional shape of the line pattern to change in width at a top section, peak width 913 of the line profile, as yet another image characteristic quantity, indicates a tendency for the cross-sectional shape of the line pattern to change in width at a vertical middle section, average width 914 of the inside of the right-side white band indicates roundness of a top section at the right side of the cross-sectional shape of the line pattern, average width 915 of the inside of the left-side white band indicates roundness of a top section at the left side of the cross-sectional shape of the line pattern, average width 916 of the outside of the right-side white band indicates a shape of a bottom section at the right side of the cross-sectional shape of the line pattern, average width 917 of the outside of the left-side white band indicates a shape of a bottom section at the left side of the cross-sectional shape of the line pattern, right-side white band width 918 indicates a tendency for the right sidewall of the cross-sectional shape of the line pattern to change in width, and left-side white band width 919 indicates a tendency for the left sidewall of the cross-sectional shape of the line pattern to change in width.

Figure 10:
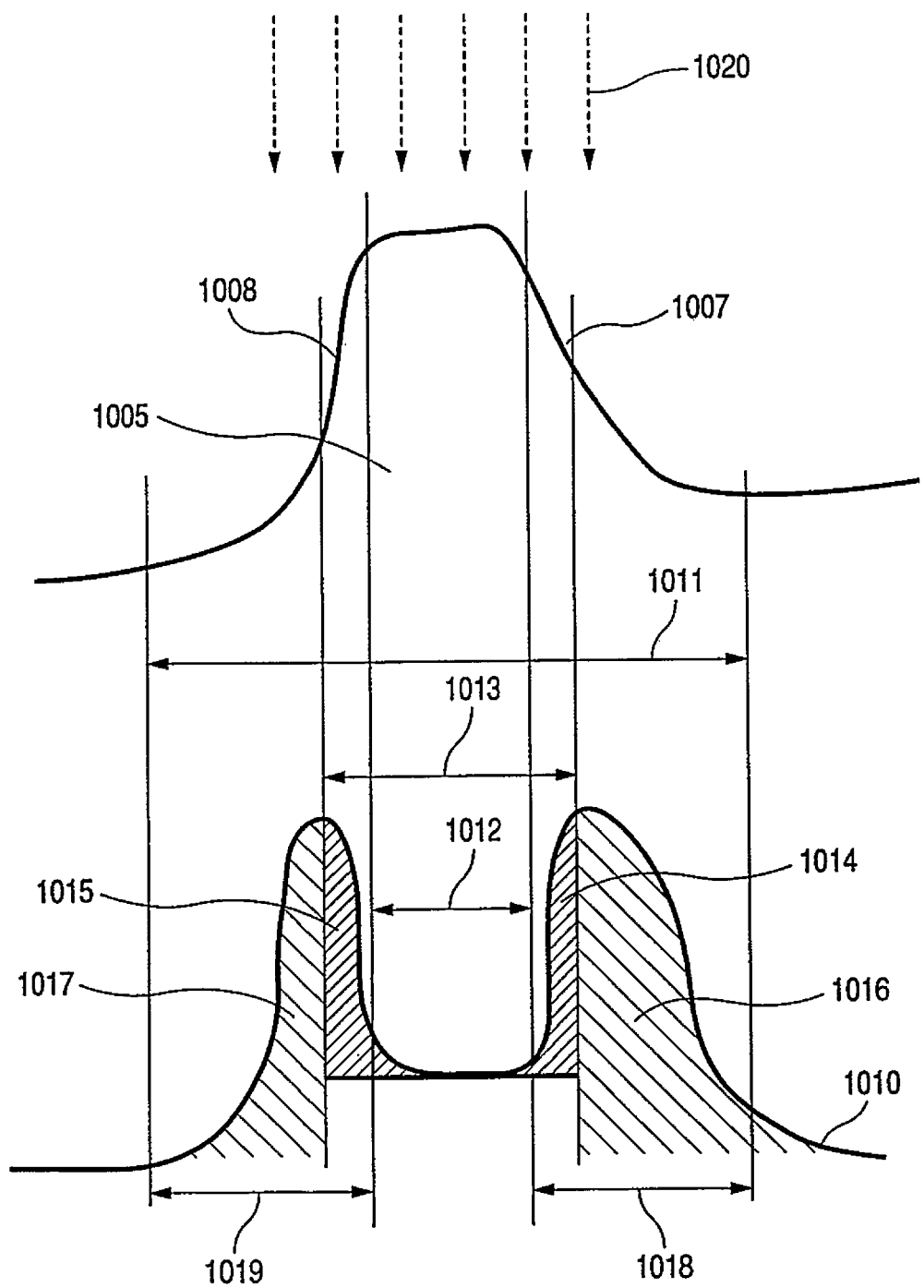
FIG. 10 is a diagram explaining a method of calculating tilt image characteristic quantities indicative of a cross-sectional shape of a pattern, from learning data samples or a tilt SEM image to be measured.

Next, tilt MPPC image characteristic quantities are described below. For the characteristic quantities that were calculated using the line profile created from the foregoing SEM image, since only a top-down image of the pattern is used to acquire cross-sectional shape information thereof, sidewall shapes, height information, or footing shape of a line pattern, for example, may not be properly observable because of the pattern shape. Accordingly, a description based on FIG. 10 will be given hereunder of a method in which the image characteristic quantities indicating the cross-sectional shape of the pattern can be calculated, even under the above situation, by using the tilt SEM image discussed in the description of the foregoing CD-SEM.

As discussed in the description of the CD-SEM configuration, several ways are available to obtain the tilt SEM image. For simplicity, a description is given below assuming that a relatively inclined pattern 1005 is irradiated with SEM electrons 1020 from above. In this case, since the pattern 1005 is inclined, a large number of regions at a right sidewall 1007 of the line pattern (1005) are irradiated with electron beams. Consequently, a white band 1018 at the right sidewall side, defined by the right sidewall 1007, becomes thick, compared with the white band in the top-down SEM image. Conversely, at a left sidewall 1008 of the line pattern 1005, the number of regions irradiated with the electron beams is small, so a white band 1019 at the left sidewall side becomes thin, compared with the white band in the top-down SEM image.

In this way, inclining the pattern with respect to an irradiating direction of the electron beams makes it possible to expand an observing region for the right sidewall of the line pattern 1005 and thus to observe this sidewall in more detail than in the top-down SEM image. Image characteristic quantities for acquiring cross-sectional shape information from the tilt SEM image can be calculated by calculating, from a line profile 1010 obtained from the tilt SEM image, image characteristic quantities 1011-1019 similar to the MPPC characteristic quantities 911-919 shown in FIG. 9B.

Figure 11B:
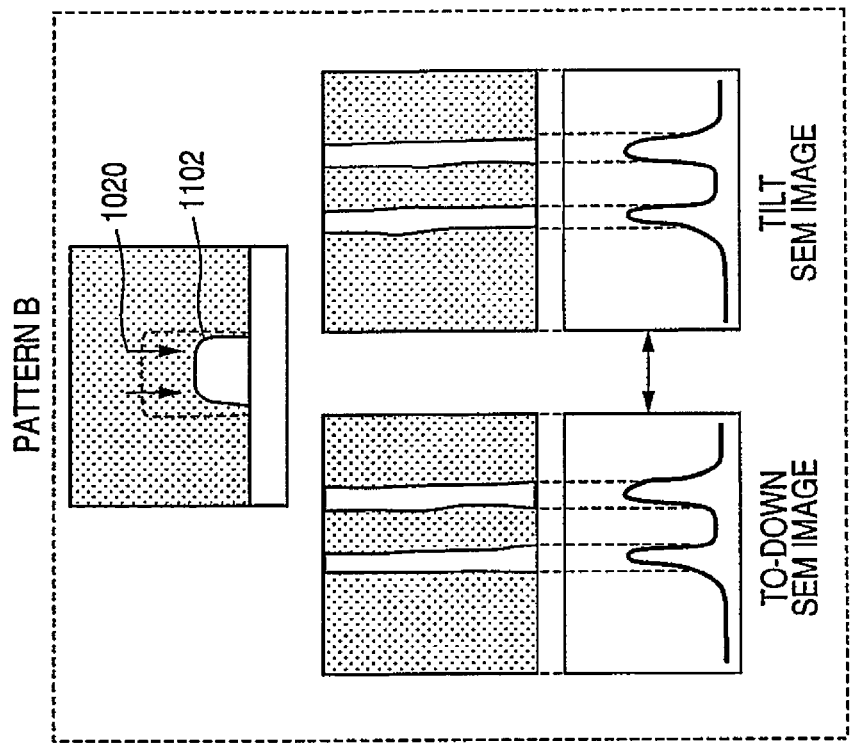
FIG. 11B is a cross-sectional view of a pattern of reduced height, also showing a top-down SEM image and tilt SEM image associated with the pattern.
Figure 11A:
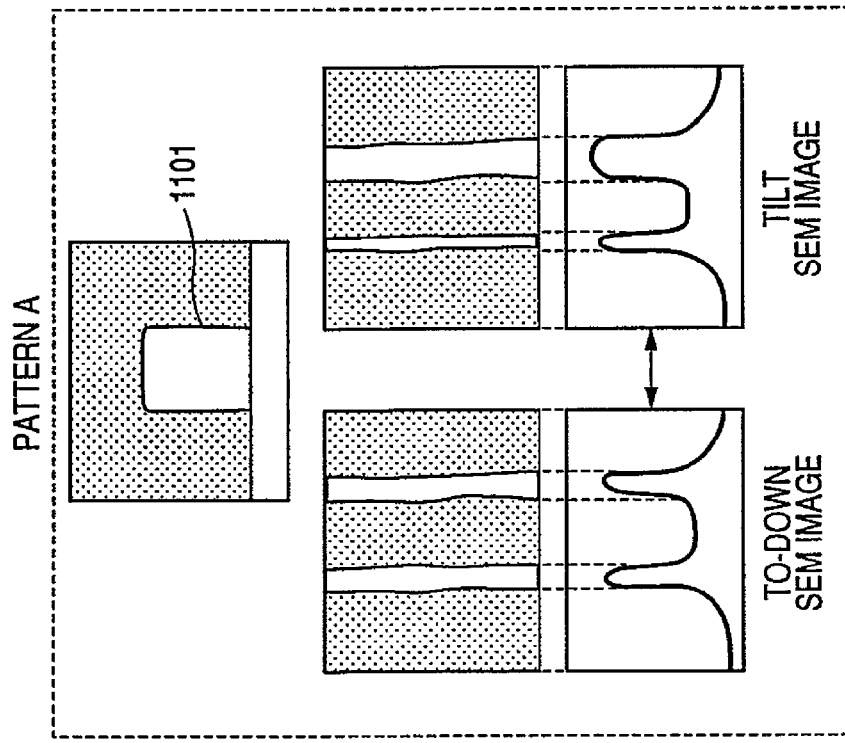
FIG. 11A is a cross-sectional view of a pattern of a normal cross-sectional shape, also showing a top-down SEM image and tilt SEM image associated with the pattern.

Next, differential tilt MPPC image characteristic quantities are described below. Using the tilt MPPC image characteristic quantities 1011-1019 as described above makes it possible to obtain better calculation results on the cross-sectional shape, than those obtained using only the MPPC characteristic quantities 911-919 of the top-down SEM image. However, the image characteristic quantities indicating the cross-sectional shape of the pattern can likewise be calculated by using variations in the image characteristic quantities calculated at different tilt angles (hereinafter, these image characteristic quantities are called the differential tilt MPPC image characteristic quantities). An example in which the differential tilt MPPC image characteristic quantities become effective for calculating the cross-sectional shape of the pattern is described below using FIGS. 11A and 11B. A pattern of a normal cross-sectional shape is shown as pattern A (1101) in FIG. 11A, and a pattern reduced in height is shown as pattern B (1102) in FIG. 11B. Since pattern A has its MPPC image characteristic quantities and its tilt image characteristic quantities calculated using a tilt image as described above, the right-sidewall white band of the tilt MPPC image characteristic quantities becomes thick, compared with that of an associated top-down SEM image, and the left-sidewall white band of the tilt MPPC image characteristic quantities becomes thin, compared with that of the top-down SEM image. However, for a pattern reduced in height, such as pattern B, even when a tilt SEM image thereof is used, a differential value between the right-sidewall white band of the tilt MPPC image characteristic quantities in the tilt SEM image and the right-sidewall white band of the MPPC image characteristic quantities in an associated top-down SEM image does not change, compared with a differential value of pattern A. The same also holds true for the left-sidewall white bands in both SEM images. These are due to the fact that since the sidewalls of pattern B are reduced in height, even if an observing region for the sidewalls of the pattern is expanded on the tilt image, the expansion does not appear as increases in widths of the white bands. The white-band widths of pattern A in the differential tilt MPPC image characteristic quantities, therefore, take a larger value than the white-band widths of pattern B in the differential tilt MPPC image characteristic quantities. The differential tilt MPPC image characteristic quantities discussed here are an example of image characteristic quantities effective for calculating the three-dimensional shapes of the patterns which were obtained from the tilt images formed at different tilt angles.

Figure 12A:
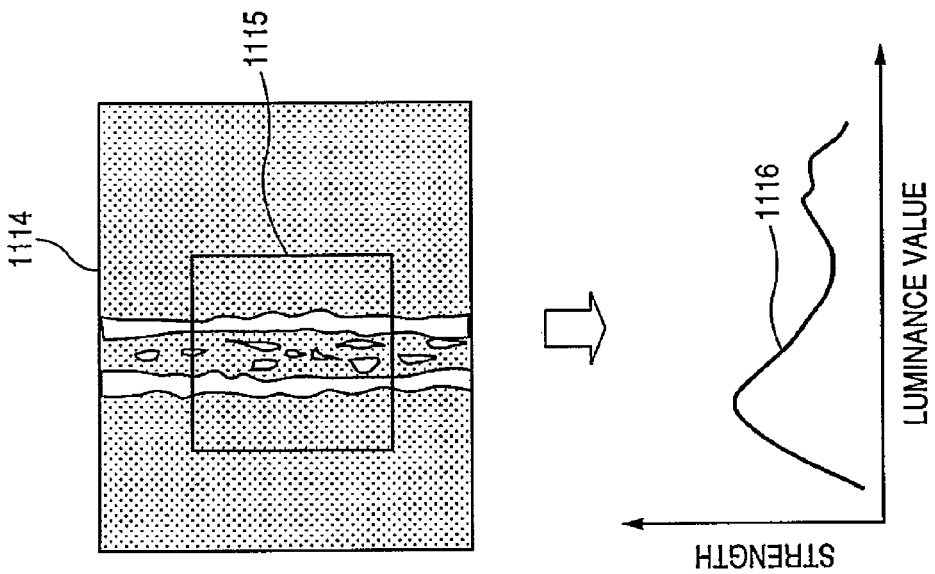
FIG. 12A shows, in an upper section, a SEM image of a pattern whose top indicative of a region to be subjected to textural analysis takes a relatively planar shape, and in a lower section a signal strength frequency distribution of the textural analysis region.

Next, image characteristic quantities based on textural analysis are described below. Specifically, a method of calculating image characteristic quantities effective for cross-sectional shape calculation of a pattern, from a SEM image of the pattern, is described as an example below using FIGS. 12A and 12B. The image characteristic quantities described here are characterized in that two-dimensional information within an image region which contains the pattern is calculated from the SEM image thereof. A method of calculating image characteristic quantities effective for cross-sectional shape calculation of the pattern is described below as an example of calculating the above image characteristic quantities. As shown in FIG. 12A, in this calculation method, a textural analysis region 1112 to be subjected to textural analysis of the pattern is specified in a SEM image 1111. The textural analysis region 1112 is specified so that at least the pattern is included in the region. An example of the textural analysis method is by creating a frequency distribution 1113 of signal strength within the textural analysis region 1112, then calculating the image characteristic quantities that indicate a shape of the frequency distribution 1113, and taking calculation results as the image characteristic quantities of the pattern. The image characteristic quantities indicating the shape of the frequency distribution include, for example, an average, variance, skewness, and kurtosis.

When signal strength "i" has its frequency expressed as P(i), each image characteristic quantity is given by expression (1).

$$\text{Average } \mu = \sum_{i=0}^{n-1} iP(i)$$

$$\text{Variance } \sigma^2 = \sum_{i=0}^{n-1} (i-\mu)^2 P(i)$$

$$\text{Skewness } S = \sum_{i=0}^{n-1} (i-\mu)^3 P(i)/\sigma^3$$

$$\text{Kurtosis } K = \sum_{i=0}^{n-1} (i-\mu)^4 P(i)/\sigma^4$$

Expression (1)

Figure 12B:
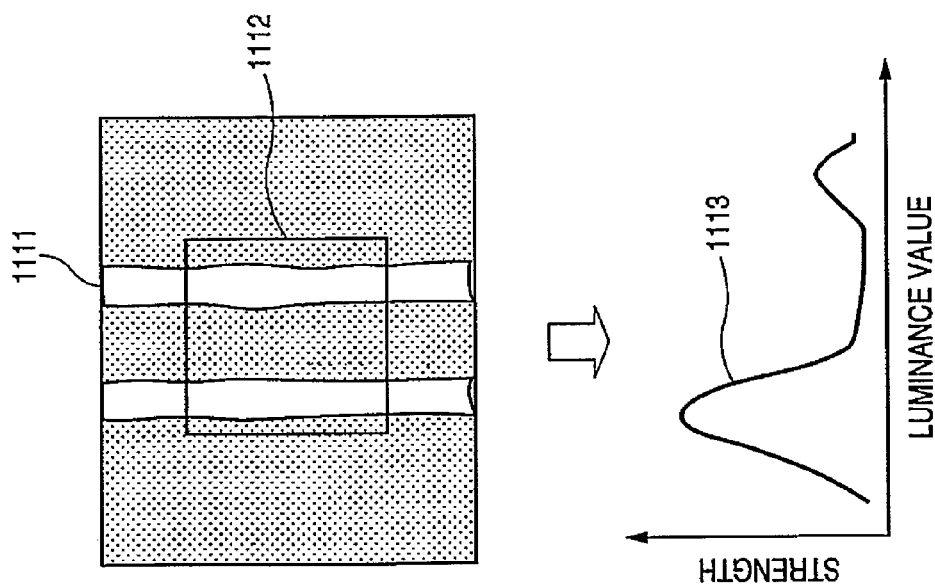
FIG. 12B shows, in an upper section, a SEM image of a pattern whose top indicative of a region to be subjected to textural analysis takes a wavy shape, and in a lower section a signal strength frequency distribution of the textural analysis region.

For example, if the pattern has its top portion formed into a wavy shape, not a planar shape, by the process parameters used for the semiconductor, the skewness and kurtosis that are textural characteristic quantities calculated from a frequency distribution 1116 of signal strength within a textural analysis region 1115 of a SEM image 1114 will, as shown in FIG. 12B, be smaller than in a SEM image 1111 of a pattern whose top is planar. Using such textural characteristic quantities as shown above provides useful information for understanding a tendency that the cross-sectional shape of the pattern exhibits. The characteristic quantities calculated from the frequency distribution of the SEM signal strength in the textural analysis discussed above are an example of image characteristic quantities effective for analyzing the cross-sectional shape of the pattern.

Figure 13A:
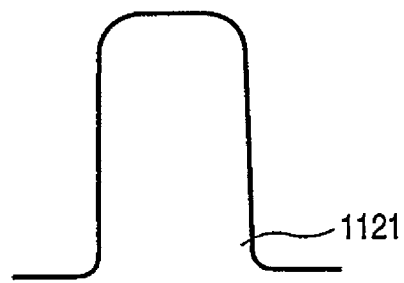
FIG. 13A is a view showing a normal cross-sectional shape of a line pattern.
Figure 13B:
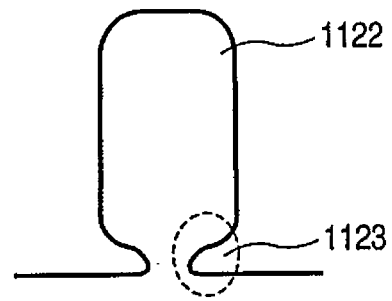
FIG. 13B is a view that shows a line pattern curved inward at its lower end to form a notched cross-sectional shape.

Next, notch detection image characteristic quantities based on line profile analysis are described below. FIGS. 13A to 13D are diagrams explaining examples of image characteristic quantities effective for cross-sectional shape detection of a pattern from a SEM image thereof. The above-mentioned line profile obtained from the SEM image exhibits a specific tendency due to the cross-sectional shape of the pattern. The tendency of the line profile is analyzed and results are calculated as image characteristic quantities. Taking these image characteristic quantities as an example, a description based on FIGS. 13A-13D is given below of the image characteristic quantities that render a notched shape 1123 of a resist pattern detectable. FIGS. 13A, 13B show cross-sectional shapes of different line patterns. FIG. 13A shows a line pattern of a normal cross-sectional shape 1121, and FIG. 13B shows a line pattern of an abnormal cross-sectional shape 1122 curved inward at bottom 1123 with respect to a vertical line. Such an abnormal cross-sectional shape with bottom 1123 is called a notched shape.

Figure 13C:
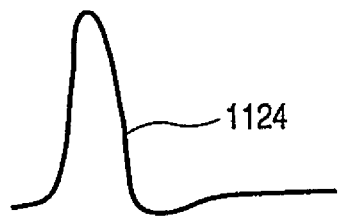
FIG. 13C is a view showing a line profile obtained from a SEM image of the normal line pattern of FIG. 13A, the line profile being associated with a right-side wall of the pattern.
Figure 13D:
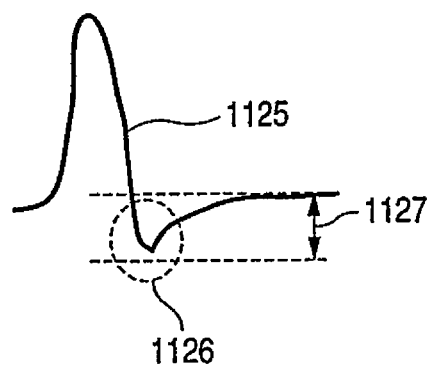
FIG. 13D is a view showing a line profile obtained from a SEM image of the line pattern taking a notched cross-sectional shape in FIG. 13A, the line profile being associated with a right-side wall of the pattern.

In comparison between line profiles obtained from SEM images of the patterns in FIGS. 13A, 13B, the line profile of the pattern's right sidewall that is associated with the notch 1123 in FIG. 13B, that is, line profile 1125 in FIG. 13D has a tendency for a base 1126 of a mountain of the line profile to decrease in signal strength, compared with the line profile 1124 shown in FIG. 13C corresponding to the pattern's right sidewall of the normal line pattern 1121 in FIG. 13A. Such a tendency is considered to be caused by an electrical charge state of the pattern due to the cross-sectional shape thereof, and by a behavior of secondary electrons due to the electrical charge. The tendency for the base 1126 of the mountain of the line profile to decrease in signal strength is calculated as an image characteristic quantity here. During the calculation of the image characteristic quantity, a differential 1127 in SEM signal strength between an underlayer and notch of the pattern under observation is calculated as an example of the image characteristic quantity. Using the tilt SEM image, in particular, that has been discussed in the description of the foregoing CD-SEM makes it possible to acquire the SEM image on which an edge effect is observed at the notch 1123 of the line pattern bottom, by irradiating the notch directly with electrons from the SEM, and to calculate the image characteristic quantity indicating a degree of the notch, by analyzing the line profile of the pattern.

Next, overhang detection image characteristic quantities are described below. FIGS. 14A to 14F are diagrams explaining examples of image characteristic quantities effective for cross-sectional shape detection of a pattern from a SEM image thereof. The above-mentioned line profile obtained from a tilt SEM image exhibits a specific tendency due to the cross-sectional shape of the pattern. The tendency of the line profile is analyzed and results are calculated as image characteristic quantities. FIG. 14A shows a cross-sectional shape 1131 of a pattern having inverse tapered sidewalls, and this shape is called an overhung shape. FIG. 14G shows a cross-sectional shape 1134 of a normal pattern.

FIGS. 14C-14F respectively show a line profile 1137 calculated from a SEM image of an overhung pattern when the pattern is observed in top-down view (1137), a line profile 1138 calculated from a tilt image of the pattern in a tilt condition (1133), a line profile 1139 calculated from a SEM image of a normal pattern when the pattern is observed in top-down view (1135), and a line profile 1140 calculated from a tilt image of the normal pattern in a tilt condition (1136).

There is almost no difference between the profiles 1137 and 1139 calculated from respective top-down SEM images. However, in comparison between the profiles 1138 and 1140 calculated from respective tilt SEM images, the line profile 1140 of the normal pattern 1134 exhibits a thick white band at either left or right as described above (in FIG. 14F, the white band at the right sidewall is thick). In contrast to this, the overhung pattern 1131 has a tendency not to exhibit thick white bands in the line profile 1138 at up to a certain tilt angle, because of the occurrence of the electrical charge of the pattern and behavior of secondary electrons due to the pattern shape.

Image characteristic quantities that indicate these differences between the line profiles of the normal pattern 1134 and overhung pattern 1131 are calculated and calculation results are taken as image characteristic quantities for use in cross-sectional shape calculation of the pattern. These image characteristic quantities calculated from line profiles include, for example, the foregoing tilt MPPC image characteristic quantities. The MPPC image characteristic quantities of the line profiles obtained from tilt SEM images during imaging of the patterns described above are an example of image characteristic quantities effective for calculating the cross-sectional shape of the overhung pattern, and using the image characteristic quantities obtained from the line profiles created from tilt SEM images due to various such cross-sectional pattern shapes makes it possible, during the calculation of a cross-sectional pattern shape, to obtain better calculation results on the cross-sectional shape.

The above-described top-down MPPC image characteristic quantities, tilt MPPC image characteristic quantities, differential tilt MPPC image characteristic quantities, image characteristic quantities based on textural analysis, notch detection image characteristic quantities based on line profile analysis, and overhang detection image characteristic quantities are effective during cross-sectional pattern shape calculation of the learning samples and to-be-measured patterns described in FIGS. 4 to 7. In addition, changes in process parameters appear as changes in the cross-sectional shape of the pattern being formed, so a tendency of the process parameters can be understood by using the above-described image characteristic quantities and analyzing the changes in the cross-sectional shape of the pattern being formed. These image characteristic quantities, therefore, become effective characteristic quantities during cross-sectional pattern shape calculation of the patterns described in FIGS. 5 to 7. Furthermore, since the device performance of the pattern being formed is significantly affected by the cross-sectional shape of the pattern, the device performance can be estimated by using the above-described image characteristic quantities.

(Estimation Engines)

Part or all of the estimation engines discussed in Japanese Patent Application No. 2005-320319 can be used as the estimation engines relating to the present invention. These estimation engines include, for example, a k-NN method and a likelihood estimation method. The invention, however, is not limited to these estimation engines and makes it possible to select a technique usable for estimating the cross-sectional shapes or process parameters described above.

That is to say, a description is given below of selecting an estimation engine for the estimation items relating to the present invention (i.e., the cross-sectional shape of the pattern or the process parameters for forming the pattern). An appropriate estimation engine is determined as the above estimation engine based on the association between the estimation items and image characteristic quantities, which are expressed by learning data. While an example of the estimation engines used in the present embodiment will be described hereunder, these estimation engines are not limited to the embodiment and other estimation engines can likewise be used. The examples of estimation with an engine, which is described below, employ the likelihood estimation method, the k-NN method, or a method based on multiple-regression analysis.

Each type of estimation engines has its specific features discussed below, and as described above, an appropriate estimation engine is selected according to the particular relationship between estimation items and image characteristic quantities. If a distribution between the estimation items and the image characteristic quantities has continuity and is essentially free from bias, the likelihood estimation method or multiple-regression analytical method using a functional equation to provide the distribution with approximation is suitable. Both methods are advantageous in that approximation makes them insusceptible to the exceptional value contained in respective learning data.

However, there is the problem that an appropriate functional equation needs to be set for approximation. Conversely, if the distribution mentioned above is low in continuity and has a significant bias, the k-NN method that does not involve approximation of the distribution with a functional equation is suitable. This method has an advantage in that it is effective in cases where the approximation with a functional equation is difficult. This method, however, has the problem that it is susceptible to the exceptional value contained in associated learning data. With these advantages and problems taken into account, an appropriate estimation engine is selected according to the particular relationship between estimation items and image characteristic quantities.

Next, a method of estimating a cross-sectional shape or process parameters of a pattern, based on the likelihood estimation method, is described as an example below using FIGS. 15 and 16A to 16C. The example described below uses the above-mentioned likelihood estimation method for the estimation engine. Here, it is assumed that a cross-sectional shape is estimated. For process parameter estimation, the cross-sectional shape may be replaced with process parameters in the description. Although it has been discussed that the likelihood estimation method is used for the estimation engine in the example, likelihood estimation is not the only method applicable and other types of estimation engines can be used; there are no limitations, if the above-mentioned image characteristic quantities of the pattern to be measured are used as an input in the cross-sectional shape or process parameter estimating method actually selected.

Figure 16A:
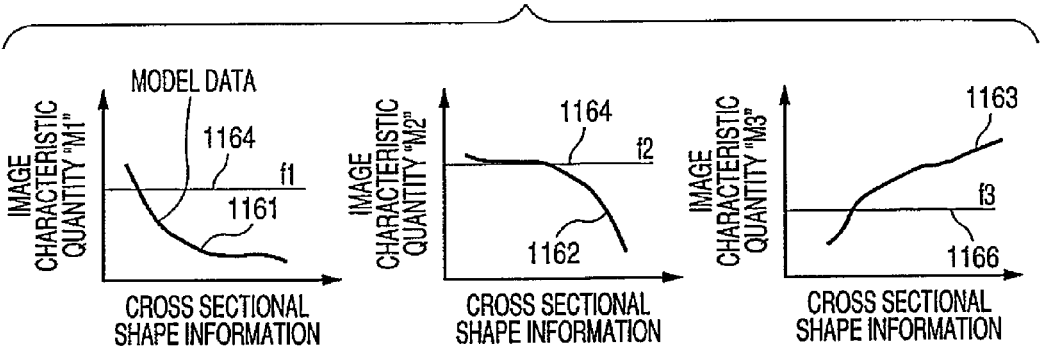
FIG. 16A graphically shows a relationship between cross-sectional shape information which has been calculated from a SEM image of a pattern subjected to cross-sectional shape estimation, and an image characteristic quantity of the cross-sectional shape, FIG. 16B graphically shows a relationship between the cross-sectional shape information and a likelihood function of the image characteristic quantity, and FIG. 16C graphically shows results obtained by multiplying likelihood distributions derived from the image characteristic quantity.
Figure 16B:
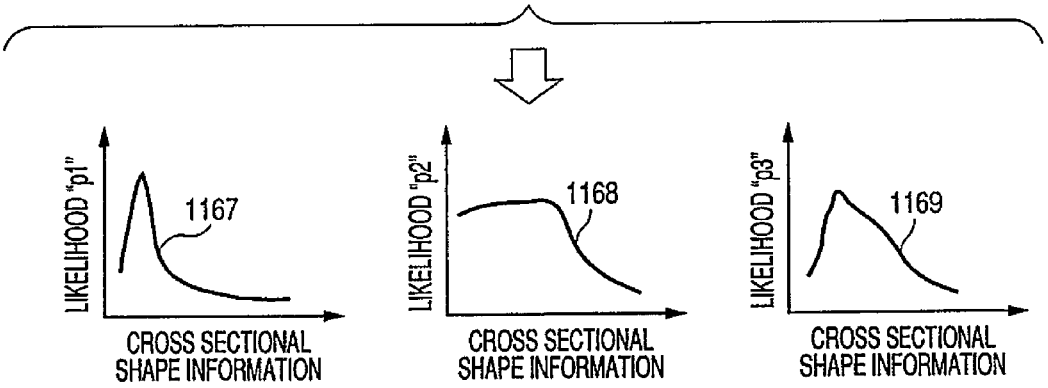
Figure 16C:
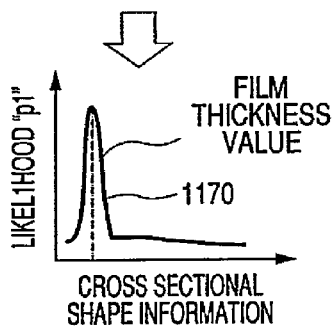

FIG. 15 shows a method in which learning data for cross-sectional shape estimation is created in the estimation engine learning process step (306) of the learning process step 300 shown in FIG. 4. FIGS. 16A-16C are diagrams showing a method in which cross-sectional shapes of patterns to be measured are calculated by collating the image characteristic quantities that have been calculated from each pattern, with the learning data for cross-sectional shape estimation in the pattern cross-sectional shape estimating step (332) of the performance process step 350 shown in FIG. 4. In the example described below, the number of image characteristic quantities for use in cross-sectional shape estimation is limited to three for simplicity in the description.

In the learning process step 300, SEM images of various cross-sectional shapes are acquired from various learning samples in the learning data acquisition step 301, and the learning processor 4071 calculates image characteristic quantities from the acquired SEM images and derives an association between each calculated image characteristic quantity and the cross-sectional shape of each pattern. Upper graphs 1151 to 1153 in FIG. 15 each represent the specific association between each calculated image characteristic quantity "mk(t)" and cross-sectional shape "t" (such as pattern height) of the pattern, plotted with the cross-sectional shape taken on a horizontal axis and the image characteristic quantity (m1, m2, m3) on a vertical axis. Next as shown in lower graphs 1154 to 1156 of FIG. 15, the upper graphs 1151 to 1153 in FIG. 15 are smoothed to create the learning data (model data "Mk(t)") that associates the cross-sectional shape "t" of the pattern and the image characteristic quantity (m1, m2, m3). The learning data is created for each image characteristic quantity, with "Mk(t)" as a function identifying the learning data, "t" as a value identifying the cross-sectional shape, "k" (k=1 . . . n) identifying the image characteristic quantity, and "n" denoting the number of image characteristic quantities. The calculated learning data is temporarily registered in the database 408 in step 306. After this, reliability is calculated in step 307 and then the calculated reliability is used to evaluate learning states, estimation engines, and estimation results, determine the estimation engine and learning data satisfying predetermined data criteria, and register the determined estimation engine and learning data in the database 408.

In the performance process step 350, a SEM image of the pattern to be measured is acquired and then the performance processor 4072 calculates image characteristic quantities from the acquired SEM image in step 330 and estimates the cross-sectional shape of the pattern in step 332 by collating the calculated image characteristic quantities with the cross-sectional shape estimation engine and learning data registered in the database 408. Values of the image characteristic quantities M1, M2, M3 that have been calculated from the SEM image of the pattern are expressed as f1, f2, f3, respectively, in FIG. 16A. Suppose that as shown in FIG. 16A, the values f1, f2, f3 of the image characteristic quantities are equivalent to 1164, 1165, 1166 on the three sets of learning data, 1161, 1162, 1663. Also, suppose that a variation in image characteristic quantity "fk" complies with a normal distribution of standard deviation "ρk". The likelihood function "pk(t)" (k=1 . . . n) shown in expression (2) is calculated on the suppositions.

$$pk(t)=1/\sqrt{2\pi}=\exp(-(fk-Mk(t))^2/2\sigma k)$$ Expression (2)

where "pk(t)" is a value indicating that the cross-sectional shape (such as pattern height) exhibits a probability of "t". A value appropriate for actual variations in process parameters associated with the image characteristic quantity "fk" is given as "ρk". Examples of a calculated likelihood function are shown as graphs 1167, 1168, 1169 in FIG. 16B. As the likelihood in each image characteristic quantity increases, the likelihood indicates a cross-sectional shape closer to that of the pattern under measurement. As shown in expression (3), multiplications are performed with the likelihood distributions (p1(t), p2(t), . . . pn(t)) that have been calculated from each image characteristic quantity. The cross-sectional shape having the greatest value in FIG. 16C, that is, cross-sectional shape 1170 with "maxP(j)" takes the value "t" that indicates the cross-sectional shape of the pattern, as shown in expression (4).

$$P(t) = p1(t) \times p2(t) \times \wedge \times pn(t)$$ Expression (3)

$$t = \{t | P(t) = \max_j P(j)\}$$ Expression (4)

Next, a method of estimating a pattern cross-sectional shape or process parameters with multiple-regression analysis is described as an example below. In the estimation method based on multiple-regression analysis, the desired cross-sectional shape of the pattern is calculated from the sum obtained by multiplying weights suitable for estimating the cross-sectional shape, that is, regression variables (a, b1, b2, . . . ) for each image characteristic quantity that was calculated from the SEM image of the pattern. The regression variables are calculated from the image characteristic quantities (x1, x2, . . . ) of the SEM images of the various learning samples used in step 306 (creation of learning data for cross-sectional shape estimation) of the learning process step 300 in FIG. 3. The thus-created multiple-regression equation is registered in the database 408 as the learning data for cross-sectional shape estimation. An example of the multiple-regression equation used is shown in expression (5) or the like.

$$y=a+b1 \times 1+b2 \times 2+$$ Expression (5)

where "y" is an object variable denoting the cross-sectional shape of the pattern, such as pattern height, and "x1" and "x2" are descriptive functions each denoting the image characteristic quantity (such as line width characteristic quantity) that was calculated from the SEM image of the pattern. Also, "a", "b1", and "b2" are the weights suitable for estimating the cross-sectional shape, and these weights are multiplied by the above-calculated image characteristic quantities stored within the database 408, for example, and are each a constant term (i=1, 2, . . . , n), where "n" is a total number of image characteristic quantities.

In the performance process step 350, image characteristic quantities are calculated from the SEM images of the pattern to be measured, and then the cross-sectional shape of the pattern is calculated by applying each calculated characteristic quantity to the learning data for cross-sectional shape estimation, shown in the multiple-regression equation of expression (5).

Figure 17:
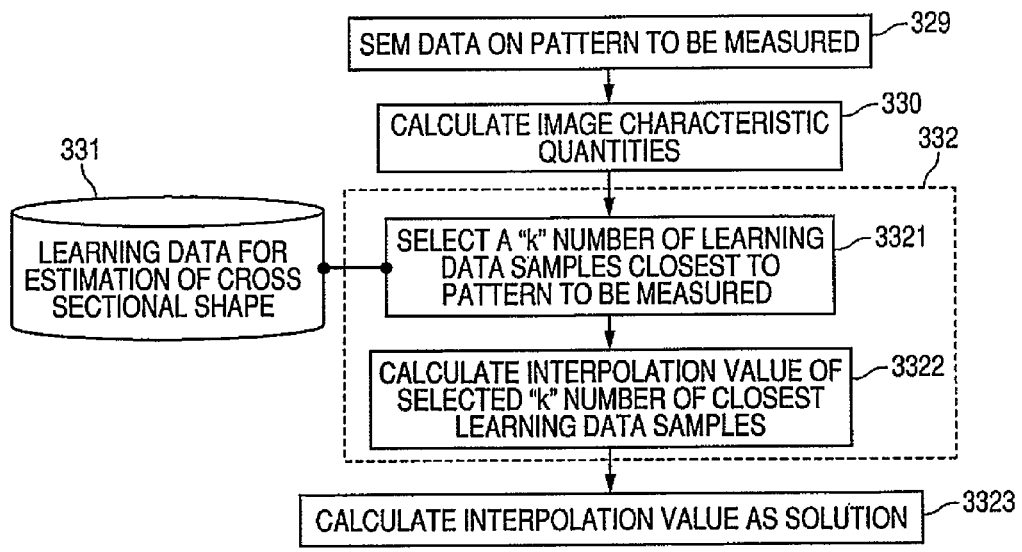
FIG. 17 is a diagram showing a method of estimating a cross-sectional shape, process parameters, or device characteristics of a pattern under measurement, using a k-NN method.
Figure 18:
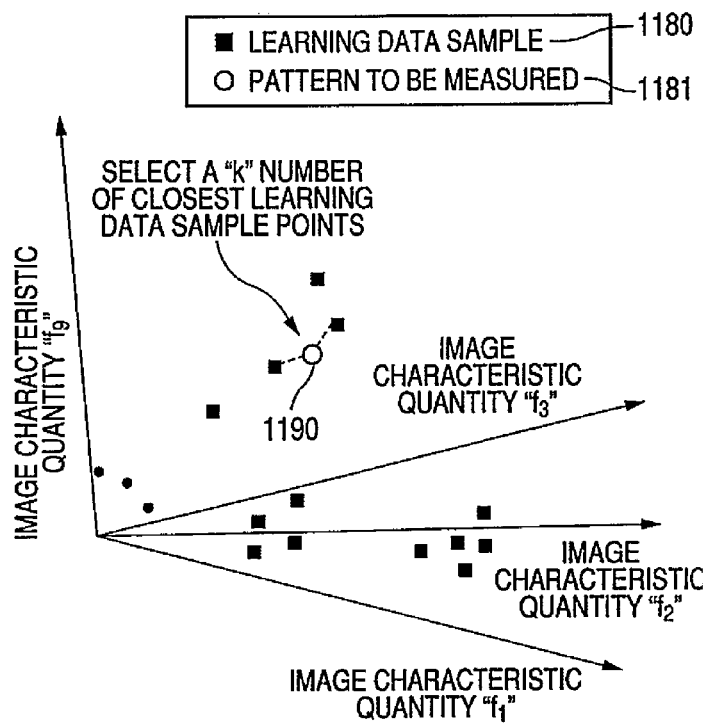
FIG. 18 is an explanatory diagram of the k-NN-based method of estimating the cross-sectional shape, process parameters, or device characteristics of the pattern under measurement.

Next, the cross-sectional shape or process parameter estimation of a pattern that uses the k-NN method is described as an example below using FIGS. 17 and 18. FIGS. 17 and 18 are diagrams that explain estimation which uses the k-NN method as the above-mentioned estimation engine in an example of estimating a cross-sectional shape or process parameters of a semiconductor pattern, in which example, pattern height 804 is estimated as an index value of the cross-sectional shape of the pattern shown in FIG. 8A. For process parameter estimation, the cross-sectional shape may be replaced with process parameters in the description. Although it has been discussed that the k-NN method is used as the estimation engine in the example, this method is not the only method applicable and other types of estimation engines can be used; there are no limitations, if the above-mentioned image characteristic quantities of the pattern to be measured are used as an input in the cross-sectional shape or process parameter estimating method actually selected.

FIG. 17 is a process flow diagram of estimating a cross-sectional shape or process parameters of a pattern using the k-NN method. In this method, a combination between image characteristic quantities and cross-sectional shapes of patterns of various learning samples (cross-sectional shapes) which have been determined from evaluations based on reliability calculation is registered in step 331 as the learning data for cross-sectional shape estimation, shown in FIG. 4. That is to say, this method, unlike the likelihood estimation method, does not include creating the function that identifies learning data. After the above registration, a SEM image of the pattern is acquired in step 329 and then image characteristic quantities are calculated from the acquired SEM image in step 330. Next in pattern cross-sectional shape estimating step 332, a "k" number of learning samples closest to the pattern to be measured, in an associated image characteristic quantities space, is selected in substep 3321. An interpolation value based on displacement vectors between the pattern and each learning sample is calculated in substep 3322 for the cross-sectional shapes (such as pattern height) of the selected "k" number of learning samples closest to the pattern to be measured, and the calculated value is defined as an estimation value of the cross-sectional shape (e.g., height) of the pattern to be measured, in substep 3323. The value of "k" here can be any value ranging from 1 to the total number of learning samples, and is defined according to a particular distribution state of the learning samples in the image characteristic quantities space.

FIG. 18 is a conceptual diagram that shows the selection of a "k" number of learning samples closest the pattern to be measured, in the image characteristic quantities space, in substep 3321. In this diagram, the number of image characteristic quantities is taken as nine (f=(f1, f2, f3, ..., f9)$^T$), and the learning samples 1180 that were registered in a learning process step are distributed in the image characteristic quantities space.

Next, a "k" number of learning samples closest to the pattern to be measured in terms of distance "d(f, f')", which is the distance from the pattern to be measured, in the image characteristic quantities space, are selected on the basis of the image characteristic quantities (f=(f1, f2, f3, ..., f9)$^T$) that were calculated from the pattern. Distance "d(f, f')" is given as a Euclidean distance by expression (6).

$$d(f, f') = \sqrt{\sum_{j=1}^{9} (fj - fj')^2} \quad \text{Expression (6)}$$

The cross-sectional shape (e.g., height H) of the pattern to be measured is calculated using an interpolation equation given by expression (7) based on the cross-sectional shapes (e.g., height) of the selected "k" number of learning samples.

$$H = h0 + \sum_{j=1}^{9} wj fj' \quad \text{Expression (7)}$$

where "wj" (weight) and "h0" are calculated from the selected "k" number of learning samples, both calculations using the least-square method.

Thus, it becomes possible to estimate the cross-sectional shape (e.g., pattern height H) of the pattern to be measured.

As described above, based on part or all of the image characteristic quantity data which has been calculated from a SEM image of a pattern to be measured, estimation of a cross-sectional shape thereof or estimation of the process parameters used to form the pattern can be achieved by conducting a estimation process with learning data (data that consists of a combination between SEM images and cross-sectional shape information or process parameter information associated with the SEM images) and with an estimation engine such as the likelihood estimation method, multiple-regression analytical method, or k-NN method.

(Reliability of Image Characteristic Quantities)

Figure 19:
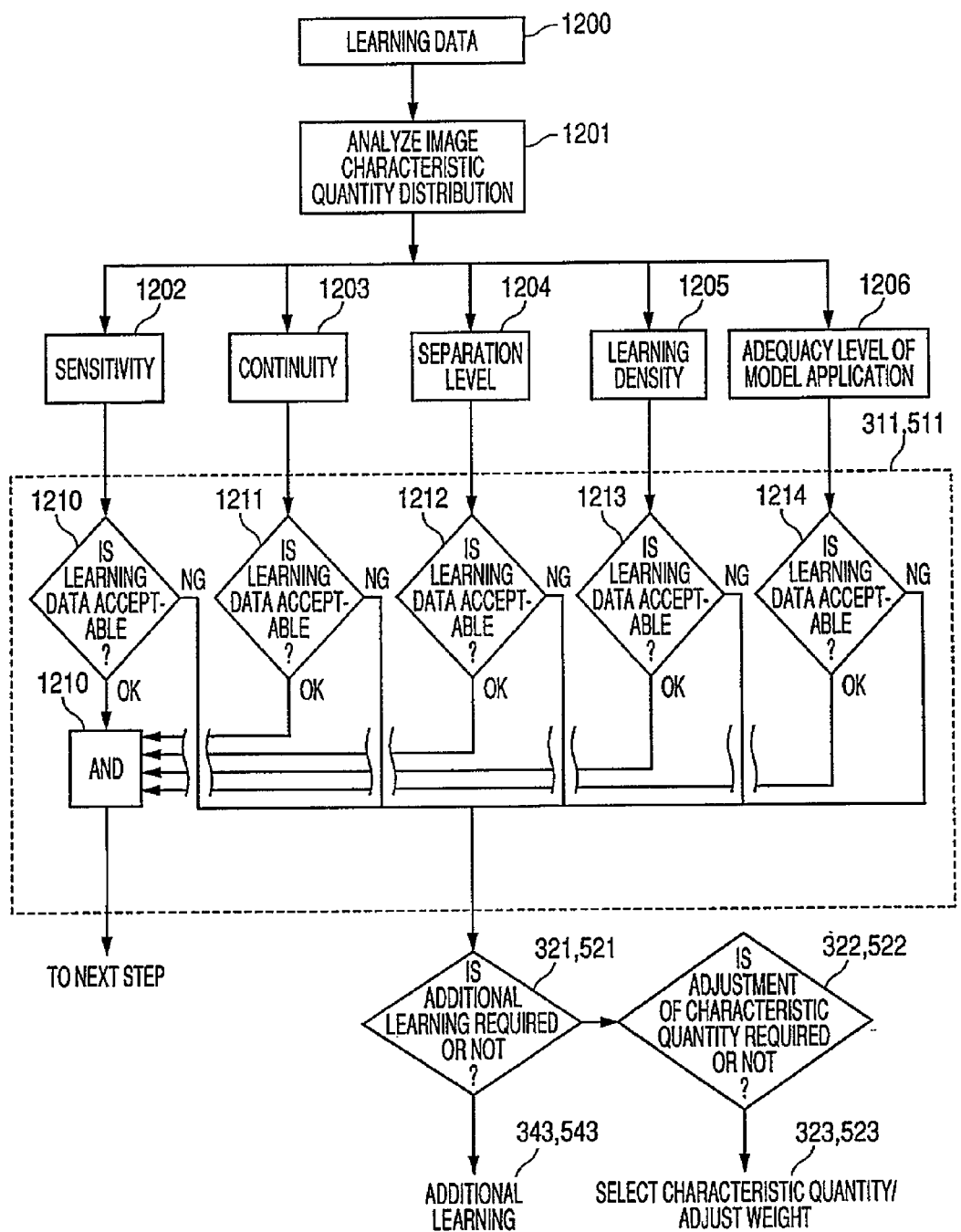
FIG. 19 is an explanatory diagram of an evaluation outline of a learning state (image characteristic quantities)

FIG. 19 is a diagram that explains a learning state evaluation method (311, 511) which, in an estimation technique based on the reliability of the cross-sectional shape or process parameter estimating method according to the present invention, uses the reliability (308 in FIG. 4 or 508 in FIG. 5) of the above-mentioned image characteristic quantities calculated from a SEM image. In this evaluation method, the reliability (308, 508) of the image characteristic quantities can be calculated from a distribution state thereof, and based on the calculated reliability, judgments can be performed in step 321, 521 to determine whether additional learning of learning data is necessary, and in step 322, 522 to determine whether image characteristic quantities adjustment is necessary. Image characteristic quantities distribution state analyzing step 1210 described later is conducted for the distribution state of the image characteristic quantities that were calculated from the SEM images 302, 502 associated with the learning data described in FIGS. 4 and 5 (in FIG. 19, denoted as 1200). After the analysis of the image characteristic quantities distribution state, reliability 1202 of the image characteristic quantities, continuity 1203 thereof, a separation level 1204 thereof, learning density 1205 thereof, or model application appropriateness 1206 thereof is calculated as the reliability of the image characteristic quantities. Although the five index values indicate the distribution state of the image characteristic quantities, the kinds of indicators usable as the index values indicating the distribution state of the image characteristic quantities are not limited to the five values.

The calculated reliability can be presented to the user in step 313, 513, through the GUI described later. Also, the user can use this presented data to judge whether the image characteristic quantities data described below has been acquired in amounts great enough for obtaining sufficient estimation accuracy in the estimated fluctuation ranges of each estimation parameter used. In addition, the user can judge in step 321, 521 to determine whether additional learning of learning data is necessary, and judge in step 322, 522 to determine whether image characteristic quantities adjustment is necessary.

First, based on the calculated reliability, acceptability judgments in steps 1210 to 1214 are performed on the image characteristic quantities. During the acceptability judgments, a threshold level is specified for each kind of reliability and if the threshold level is satisfied, the image characteristic quantities are judged to satisfy conditions of the reliability. Conversely if the threshold level is not satisfied, whether additional learning of learning data is necessary is judged in step 321, 521.

If additional learning is judged to be necessary, the process proceeds to additional learning process step 343, 543. The cross-sectional shape or process parameters to be subjected to additional learning are determined according to the above reliability. Additional learning is performed on the cross-sectional shape or process parameters whose estimation result reliability displayed through the GUI is lower than design standards, or on the cross-sectional shape or process parameters whose data tends to decrease. After the additional learning, the learning state can be confirmed through the GUI once again, and learning can thus be repeated until the design standards have been met or until the user has judged additional learning to be unnecessary.

Judgment step 322, 522 to judge whether image characteristic quantities adjustment is necessary follows if additional learning is judged to be unnecessary. If the image characteristic quantities in the learning data are judged to require adjustment, the process proceeds to image characteristic quantities selection and/or weight adjustment step 323, 523. The weight that has been defined in the weight adjustment step is used as the value for weighting the image characteristic quantities during cross-sectional shape estimation or process parameter estimation. In the same manner as that of confirmation during judgment of whether additional learning is necessary, the user can set the above weight while confirming the reliability of the image characteristic quantities via the GUI. In addition, the estimation engine reliability described later and the reliability of the estimation results can also be displayed through the GUI, so that the user can set the weight while confirming the two kinds of reliability.

During the above judgments on the image characteristic quantities, when all reliability data is ANDed in step 1210, if all the reliability data is judged to be satisfied (i.e., if the distribution of the image characteristic quantities in the learning data is judged to satisfy necessary conditions), the process proceeds to next step 327 (FIG. 4) or 527 (FIG. 5) of the learning process steps (300, 500). Thus, based on the reliability of the image characteristic quantities that were calculated from the distribution thereof in the learning data, judgments can be conducted to determine whether additional learning is necessary and whether the adjustment of the image characteristic quantities is necessary.

FIGS. 20A to 20E are diagrams explaining the reliability of the image characteristic quantities calculated from the distribution thereof in the learning data. The reliability can be used to judge, during cross-sectional shape or process parameter estimating, whether the number of samples for learning data and/or a distribution of the learning data suffices to obtain sufficient estimation accuracy in the estimated fluctuation ranges of each estimation parameter used. While five index values (sensitivity, continuity, a separation level, learning density, and appropriateness of model application) will be described hereunder as indicators of reliability, index values that can be used are not limited to the above five kinds; any index value indicating the distribution state of the image characteristic quantities in the learning data and useful for conducting the above judgments on the learning data can be used as an indicator of the reliability.

An index value 1315 of the reliability, with respect to the sensitivity 1202 shown in FIG. 19, is an index value that, as shown in FIG. 20A, denotes magnitude of a change in image characteristic quantity according to a change in a cross-sectional shape or process parameters of a distribution 1312 of the image characteristic quantities. The distribution range for calculating this index value is an estimated fluctuation range 1361 that is either a fluctuation range in which the cross-sectional shape is likely to be formed as a result of process changes, or a fluctuation range in which the process parameters are likely to become effective data in the formation of the pattern. The value of the sensitivity as the reliability, decreases in a range 1310, where a relative change in characteristic quantity with respect to a change in cross-sectional shape or in process parameters tends to become less significant than in another range 1311. In other words, in terms of reliability index 1315 of the sensitivity to the change in cross-sectional shape or in process parameters, reliability of the range 1310 where the change in characteristic quantity tends to become less significant decreases as denoted by curve 1313, and reliability of the range 1311 where the change in characteristic quantity tends to become more significant increases as denoted by curve 1314.

This means that if the reliability index value of the sensitivity in the image characteristic quantities is too small, the cross-sectional shape or the process parameters cannot be calculated accurately, even by using an appropriate model. When calculated, the magnitude of the change in characteristic quantity can be defined, for example, as a fluctuation level thereof (maximum value−minimum value) (1317) in a fixed range 1316 of the cross-sectional shape or process parameters. The method of defining the maximum value and the minimum value is an example, and a usable calculation method is not limited, if a fluctuation tendency of the characteristic quantity can be understood by using the particular method.

An index value 1327 of the reliability, with respect to the continuity 1203 shown in FIG. 19, decreases, for example, in a range 1321 as denoted by curve 1325 in FIG. 20B. In the range 1321, the distribution of the characteristic quantities is discontinuous. Conversely, in ranges 1320, 1322 where the distribution of the characteristic quantities is continuous, the index value 1327 of the reliability increases as denoted by curves 1324, 1326. For the reliability index value 1327 of the continuity, the discontinuous range in which the characteristic quantities decrease indicates that the reliability of the learning data is lowered by an acquisition failure of the learning data or other factors. This means that if the index value of the reliability as the continuity in the image characteristic quantities is too small, the cross-sectional shape or the process parameters cannot be calculated accurately, even by using an appropriate model. The distribution range for calculating this index value is the estimated fluctuation range 1361 of the cross-sectional shape or of the process parameters.

An index value 1333 of the reliability, with respect to the separation level 1204 shown in FIG. 19, is an index value that, as shown in FIG. 20C, denotes a variation in image characteristic quantity. This reliability value decreases in a range 1330 where there are significant variations, and decreases in a range 1331 where variations are insignificant. These mean that if the index value 1333 of the reliability as the separation level in the image characteristic quantities is too small, since the image characteristic quantities vary significantly for a cross-sectional shape or process parameters, the cross-sectional shape or the process parameters cannot be calculated accurately, even by using an appropriate model based on the image characteristic quantities. The distribution range for calculating this index value is the estimated fluctuation range 1361 of the cross-sectional shape or of the process parameters.

An index value 1342 of the reliability, with respect to the learning density 1205 shown in FIG. 19, is an index value that, as shown in FIG. 20D, denotes a distribution of learning data acquisition. This reliability value decreases in a range 1340 of an image characteristic quantities distribution with a small amount of or no amount of acquired learning data (low learning density), and increases in a range 1341 of an image characteristic quantities distribution with a large amount of acquired learning data (high learning density). This means that if the index value 1342 of the reliability as the learning density in the image characteristic quantities is too small, since the amount of acquired learning data is insufficient, the cross-sectional shape or the process parameters cannot be calculated accurately, even by using an appropriate model. The distribution range for calculating this index value is the estimated fluctuation range 1361 of the cross-sectional shape or of the process parameters.

An index value 1352 of the reliability, with respect to the model application appropriateness 1206 shown in FIG. 19, is an index value that, as shown in FIG. 20E, denotes an appropriateness level of model application in calculation of a model to be used for estimating with a multi-valued function assigned to a distribution of image characteristic quantities. The reliability index value 1352 of the model application appropriateness decreases when calculation results on the appropriateness level of application of the model (1350) which has been calculated (selected) for the distribution (1351) of the image characteristic quantities indicate that the appropriateness level of the model application is low. If the reliability index value 1352 of the model application appropriateness level is small, this means that the distribution of the image characteristic quantities correspondingly departs from the model used for estimation, and hence that the model requires a change (including partial modification) and/or weight adjustment. The distribution range for calculating this index value is the estimated fluctuation range 1361 of the cross-sectional shape or of the process parameters.

The foregoing judgments (evaluations) on the learning data can be conducted by calculating the above-described reliability values that indicate the distribution of the image characteristic quantities.

(Reliability of Estimation Engine)

Figure 21:
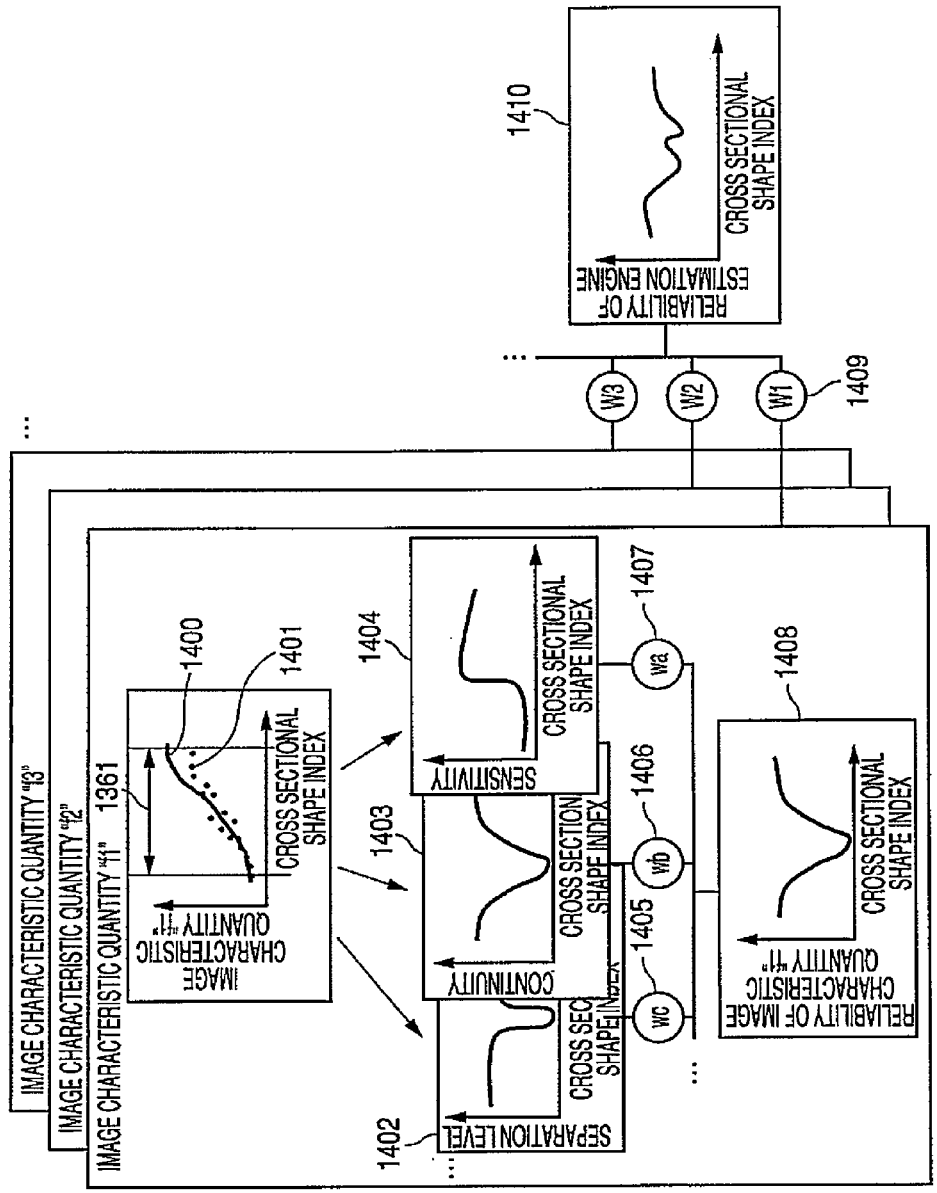
FIG. 21 is an explanatory diagram of reliability of an estimation engine.

Next, a method of cross-sectional shape or process parameters estimation based on reliability of an estimation engine relating to the present invention is described as an example below using FIG. 21. FIG. 21 is a diagram showing a method of cross-sectional shape estimation based on reliability of an estimation engine relating to the present invention. In the invention, as shown in FIGS. 4 and 5, reliability of an estimation engine can be calculated in step 309 or 509 during cross-sectional shape or process parameter estimation with the estimation engine, and an evaluation based on the calculated reliability can be conducted in step 315 or 515 to judge whether sufficient estimation accuracy is obtainable in estimated fluctuation ranges of the cross-sectional shape or process parameters estimated. That is to say, as described in FIG. 19, reliability values (1402 to 1404) for indices (sensitivity, continuity, separation level, learning density, and model application appropriateness) concerning the number and/or distribution state of learning data samples for the cross-sectional shape or the process parameters are calculated with respect to the relationship between image characteristic quantities "f1, f2, f3, . . . ," (1401) and cross-sectional shape or process parameter indices.

Each calculated reliability index value is weighted (Wa-Wc . . . , 1405-1407) and then summed up to calculate overall reliability 1408 for each image characteristic quantity. The calculated overall reliability is weighted (W1-W3 . . . ) for each image characteristic quantity and then summed up to calculate the reliability 1410 of the estimation engine. The weight value defined during weight adjustment of the image characteristic quantity is used as a weighting value for the image characteristic quantity when the cross-sectional shape or the process parameters are estimated.

The above method of calculating the overall reliability and the estimation engine reliability is an example and does not limit the present invention, and any method can be used that enables the calculation of the reliability. As described in FIGS. 4 and 5, whether the reliability 1410 of the estimation engine satisfies a set threshold level is judged in judgment (evaluation) step 315, 515 for the estimation engine, and if the threshold level is not satisfied, selection of another estimation engine and/or weight adjustment of the present estimation engine is conducted in step 319, 519. The reliability of the estimation engine can be presented to the user through the GUI in step 313, 513, and the user can perform the above adjustment while confirming the reliability via the GUI.

(Reliability of Estimating Results)

Figure 22A:
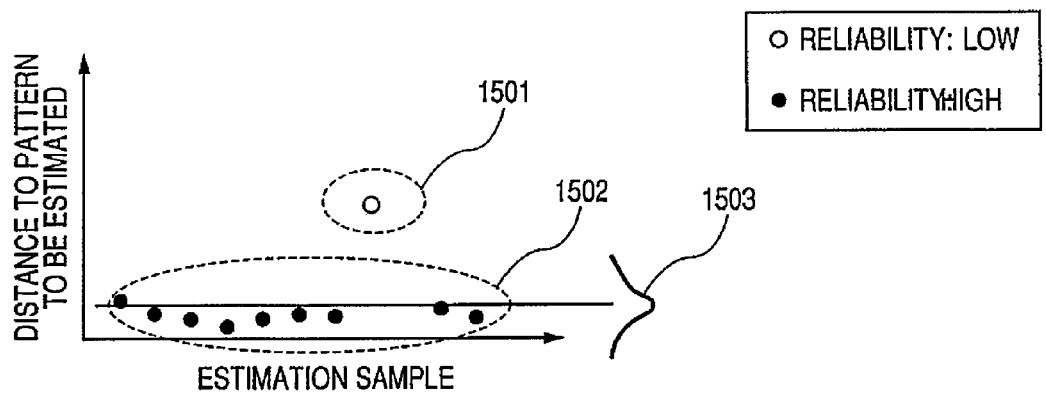
FIG. 22A is a graph showing a relationship between an object to be estimated and a distance to the object.
Figure 22B:
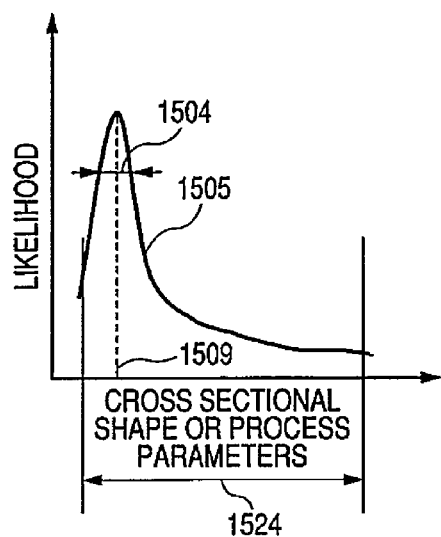
FIG. 22B is a graph of a steep likelihood distribution with respect to a cross-sectional shape or process parameters.
Figure 22C:
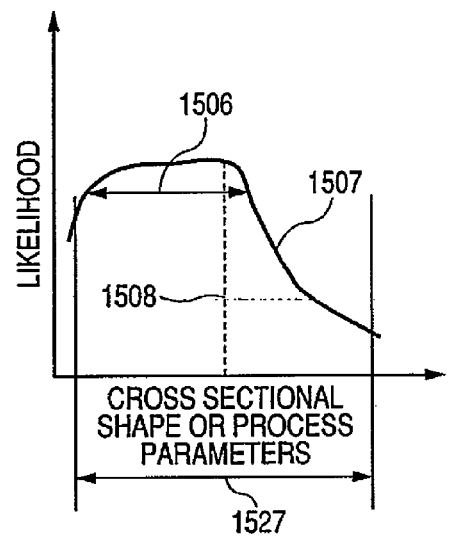
FIG. 22C is a graph of a gentle likelihood distribution with respect to a cross-sectional shape or process parameters.

FIGS. 22A to 22C are diagrams explaining a method in which the reliability (310, 510; 333, 533) of estimation results, calculated in the learning process steps 300, 500 and the performance process steps 350, 550, is used in a cross-sectional shape estimation technique using the reliability of the cross-sectional shape or process parameter estimation method according to the present invention.

During estimation with the foregoing k-NN method, as described in Japanese Patent Application No. 2005-320319, a desired cross-sectional shape or desired process parameters are estimated using the distance between the learning data (data that consists of a combination of SEM images and cross-sectional shape or process parameter information associated with the SEM images) in the image characteristic quantities space, and the subject to be estimated (the pattern measured for each estimation sample extracted arbitrarily and successively from learning samples in the learning process steps (300; 500), or in the performance process steps (350; 550)). In this estimation method, the Euclidean distance, for example, between each set of learning data and the subject to be estimated, is calculated, a "k" number of sets of learning data closest to the subject to be estimated (each estimation sample or the pattern to be measured) in terms of the distance are selected, and a process such as interpolation based on expression (7) or the like is conducted using each selected set of learning data to calculate the cross-sectional shape or process parameters (or others) of the subject to be estimated. During the interpolation, the cross-sectional shape or process parameters, for example, are calculated by assigning a weight value (wj) to each cross-sectional shape or process parameter value of the selected learning data according to the particular distance. In this technique, basically, as the distance between the subject to be estimated (estimation sample or the pattern to be measured) is shorter, estimating results higher in reliability can be obtained when the cross-sectional shape or process parameters are estimated using the k-NN method, one of estimation engines, on the basis of the image characteristic quantities of the subject to be estimated (estimation sample or the pattern to be measured). Accordingly, the above-mentioned distance is used as an example of reliability of the estimation results.

In FIG. 22A, a number of the subject to be estimated (estimation sample or the pattern to be measured) is shown on a horizontal axis, and the distance to the subject to be estimated is shown on a vertical axis. In the present example, there exists a subject 1501 to be estimated having the above-mentioned distance with respect to a distribution 1503 of a distance from a large majority of subjects 1502 to be estimated to the subject to be estimated in the learning data. The reliability of the estimation results obtained from the subject 1501 to be estimated in such a learning sample decreases for the reasons discussed above. As in the present example, therefore, if the distance to the subject to be estimated in the learning sample is long, calculations are conducted for reduced reliability of the estimation results. The reliability of the estimation results can be, for example, a reciprocal of the distance or a square of the reciprocal of the distance. If the above subject to be estimated is used as a measurement subject, the reliability of the estimation results with respect to the measurement subject will be calculated in step 333, 533.

During likelihood estimating, as shown in FIGS. 22B and 22C, in a distribution (1505, 1507) of the likelihood obtained when the parameter estimated (cross-sectional shape or process parameter) changes, a point (1509, 1508) at which the likelihood becomes a maximum is basically taken as a solution (cross-sectional shape or process parameter of the subject to be estimated). Reliability (310, 510; 333, 533) of the estimation results, however, can be calculated from a shape of the particular likelihood distribution. During likelihood estimating, it is generally considered that if the shape of the likelihood distribution is steep (1504), the estimating reliability obtained will increase, and that if the likelihood distribution is gentle (1506), the estimating reliability obtained will decrease. Accordingly, a value obtained by quantifying the shape of the likelihood distribution is calculated as the reliability of the estimation results. For example, a distribution of likelihood is extracted at a certain threshold level (say, about 80% of the likelihood maximum) and a width value (1504, 1506) of the particular distribution is calculated as the reliability of the estimation results. A calculation range of the reliability can also be extracted only from the estimated fluctuation range (1524, 1527) of the cross-sectional shape or process parameters estimated. Calculation only from the estimated fluctuation range makes it possible to eliminate cross-sectional shapes which are not formed, or process parameters which are not set up, before reliability and a solution are calculated.

As described above, the reliability of the estimation results relating to the subject to be estimated (estimating sample and measurement subject) is calculated using the selected estimation engine. A calculation method for the reliability of the estimation results is not limited to the method described above, and any method is usable that enables the calculation of the reliability of the estimation results relating to the subject to be estimated. The reliability of the estimation results relating to the subject to be estimated can be presented to the user through the GUI described later, and while confirming the reliability through the GUI, the user can conduct an acceptability judgment (in step 324, 524) on the estimation results relating to the learning sample (estimating sample) and an acceptability judgment (in step 334, 534) on the estimation results relating to the measurement subject.

Figure 23:
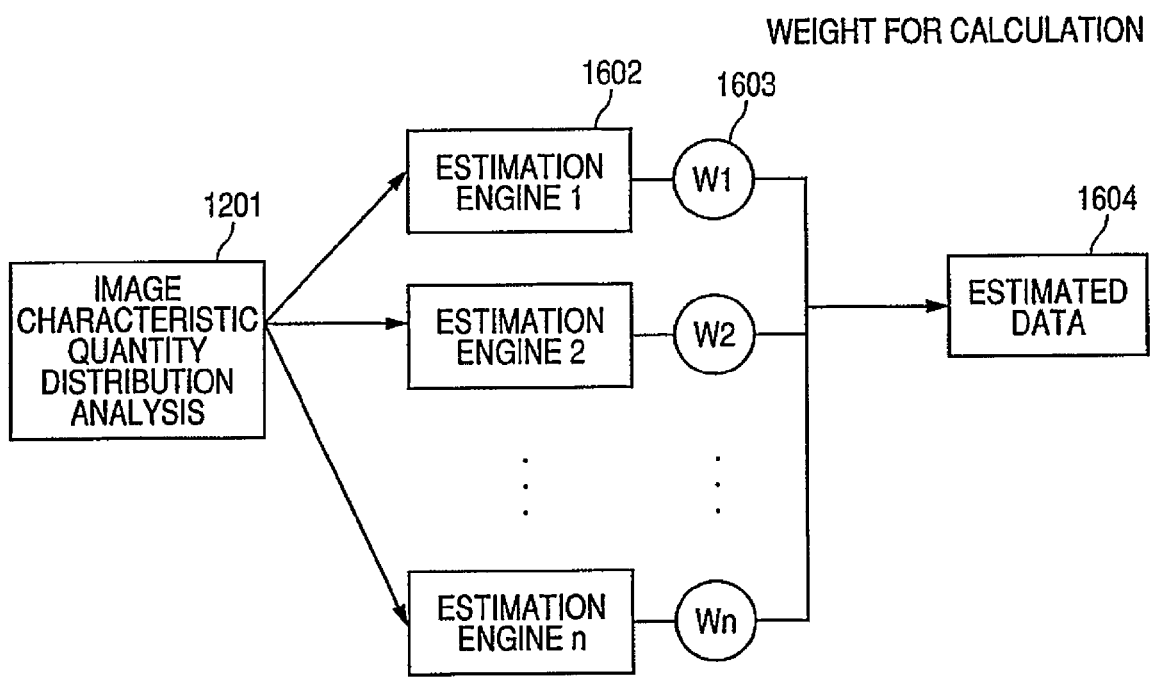
FIG. 23 is an explanatory diagram of an estimation engine combination for estimating a cross-sectional shape or process parameters of a pattern under measurement.

Next, a method of estimation engine selection and/or weighting according to the present invention is described as an example below using FIG. 23. In this method, estimating of, for example, cross-sectional shapes or process parameters or the like, based on the above reliability that is analytical results (1201) on the foregoing image characteristic quantities distribution, can be realized in a combination of plural estimation engines by selecting one or more estimation engine (1602) and assigning a weighting value (W1, W2, . . . , Wn) to each estimation engine. For example, the estimation results of the above estimation engine are summed up by conducting the above weighting process to calculate the estimated value mentioned above. The selection and weighting operations can be set using the GUI described later, and since the reliability of the image characteristic quantities, the reliability of the estimation engine, and the reliability of the estimation results are also displayed together through the GUI, these reliability values can be used to conduct image characteristic quantities and estimation engine adjustments, inclusive of the judgment on whether additional learning is necessary. The user can also calculate the above reliability obtained after the above selections and weight adjustments have been incorporated, and conduct readjustments while confirming the reliability through the GUI. The weight is used for cross-sectional shape or process parameter estimation in the performance process steps 350, 550. In this way, estimation engine selection and weight adjustment become possible.
(GUI 1)

Figure 24:
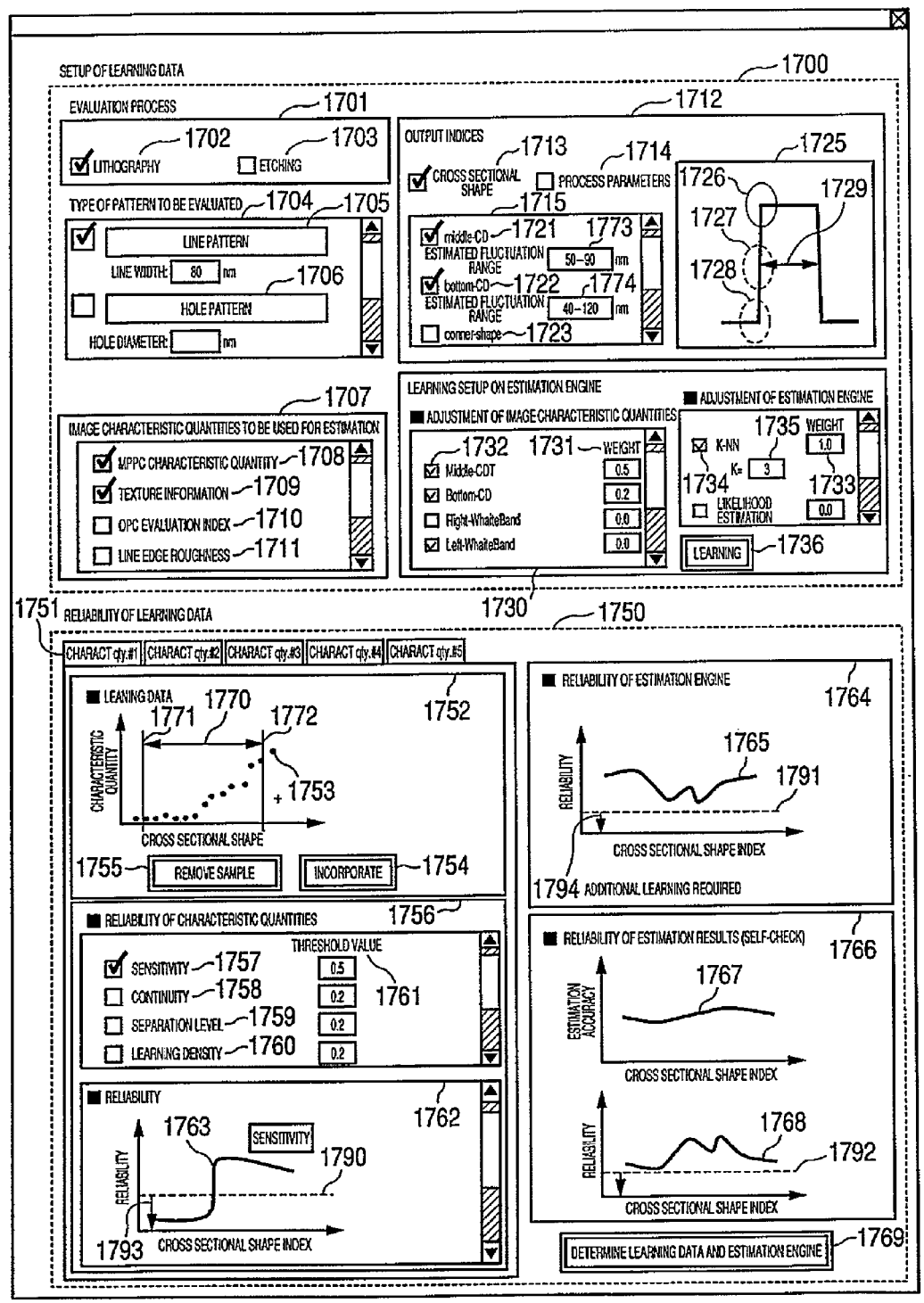
FIG. 24 is a diagram showing an example of a GUI screen menu for the learning process step.

Next, a description is given below of an example of screen display of a GUI 1 in the learning process steps 300, 500 as shown in FIG. 24, the GUI 1 being connected to the image-processing/arithmetic processing unit 407 of the semiconductor process estimation apparatus (cross-sectional shape or process parameter estimation apparatus) according to the present invention. The GUI 1 makes it possible for the user to set up various detailed data for monitoring semiconductor processes by monitoring cross-sectional shapes or process parameters. The semiconductor process estimation apparatus according to the present invention is characterized in that the apparatus has, as input GUI 1, all or part of items which enable selection of the functions shown in FIG. 24. These items are described below. The GUI 1 in this example is broadly divided into two types of items: GUI items relating to learning data setup (1700), and GUI items relating to reliability (1750) of learning data.

First, GUI items on learning data setup (1700) are described by way of example. An item (1701) is used to specify a manufacturing process to be evaluated, and makes a lithographic process step (1702) and an etching process step (1703) selectable.

An item (1712) is used to specify an evaluation mode, and makes it possible to select cross-sectional shape estimation (1713) and process parameter estimation (1744). An item (1704) is used to specify the type of pattern to be evaluated, and makes it possible to select design line width, design film thickness, and/or the like for a line pattern (1705), or to select a design hole diameter, a design aspect ratio, and/or the like for a hole pattern (1706).

An item (1707) is used to specify image characteristic quantities to be used for estimation, and makes it possible to select the image characteristic quantities to be used for estimation (e.g., MPPC image characteristic quantities 1708 and textural information 1709).

An item (1725) is used to specify and graphically display desired measurement points during cross-sectional shape estimation, and makes it possible to specify height, width (1729) of the pattern to be evaluated, a shape (1726) of a corner of the pattern, a shape (1727) of a sidewall of the pattern, a shape (1728) of a footing portion, a tilt angle of a sidewall, and so on.

Another item is used to specify desired measurement points, which are, for example, middle-CD (1721) and bottom-CD (1774). It is also possible to specify estimated fluctuation ranges (1773, 1774) during the specification of the measuring points.

Another item is related to learning setup for an estimation engine. This item can be used to enter detailed design data for the image characteristic quantities used during estimation, to select image characteristic quantities (1732), and to set up the above weight (1731) for the selected image characteristic quantities.

Also, it is possible to select an estimation engine (1734), adjust each parameter for an estimation engine (1735), and adjust a weight between estimation engines (1733).

The user can set all the above-described items. Also, if part of the items is selected, certain items can be automatically selected. Selectable items can be learnt on the basis of a past measurement history, and automatic selection of typical measurement items is also possible. For example, if the selected evaluation process (1701) is lithography (1702), the selected evaluation mode is cross-sectional shape estimation (1713), and the selected type of pattern to be evaluated (1704) is the line pattern (1705), the MPPC characteristic quantities (1708) are selected automatically as the characteristic quantities to be used for estimation, bottom-CD (1722) is selected as an output evaluation index value, and only the k-NN method is used as the estimation engine. For example, 3 can be automatically selected as a value of "k" in the k-NN method.

Furthermore, all or part of parameters to be used for estimation based on, for example, selection results of image characteristic quantities or weight adjustment results of the image characteristic quantities or selection results of the estimation engine or weight adjustment results of the estimation engine, can be registered in database 408 for each process step, product type, and process site of the subject to be estimated. When necessary, all or part of the above parameters can be called from the database 408 and various kinds of estimations can also be set up.

Next, GUI items relating to reliability (1750) of the learning data are described below. An item (1751) is used to display the above image characteristic quantities information for each characteristic quantity. An item (1753) is a distribution of the image characteristic quantities and is displayed to confirm the distribution. An item (1755) makes it possible to remove unnecessary learning samples (1755) on the basis of the reliability described later. In the present example, the estimated fluctuation ranges (1770) can also be displayed together with the above. An item (1756) is used to select reliability data of image characteristic quantities to be displayed, and makes it possible to select, for example, sensitivity (1757), continuity (1758), separation level (1759), learning density (1760), and/or others of the image characteristic quantities. It is also possible to enter the above-mentioned threshold level (1761) for evaluating the reliability of the image characteristic quantities. An item (1762) is used to display the reliability of the image characteristic quantities. The reliability with respect to cross-sectional shapes or process parameters can be displayed (1763). An item (1764) is used to display the reliability of the estimation engine. The reliability with respect to the cross-sectional shapes or process parameters can be displayed (1765). An item (1766) is used to display the reliability of the estimation results. It is possible to display estimating results (1767) based on self-checking of estimation with the learning data (self-checking with the estimation samples in the learning data), and to display reliability (1768) of the estimation results. The user can use information of the learning data setup (1700) and reliability (1750) displayed through the GUI to set up appropriate learning data and estimation engines for the desired type of estimation. The setup items displayed through the GUI in the estimation apparatus are examples of the items that enable the user to set data. However, a method of setting estimation in detail to the user in this manner makes it possible to meet various needs for process management.

(GUI 2)

Figure 25:
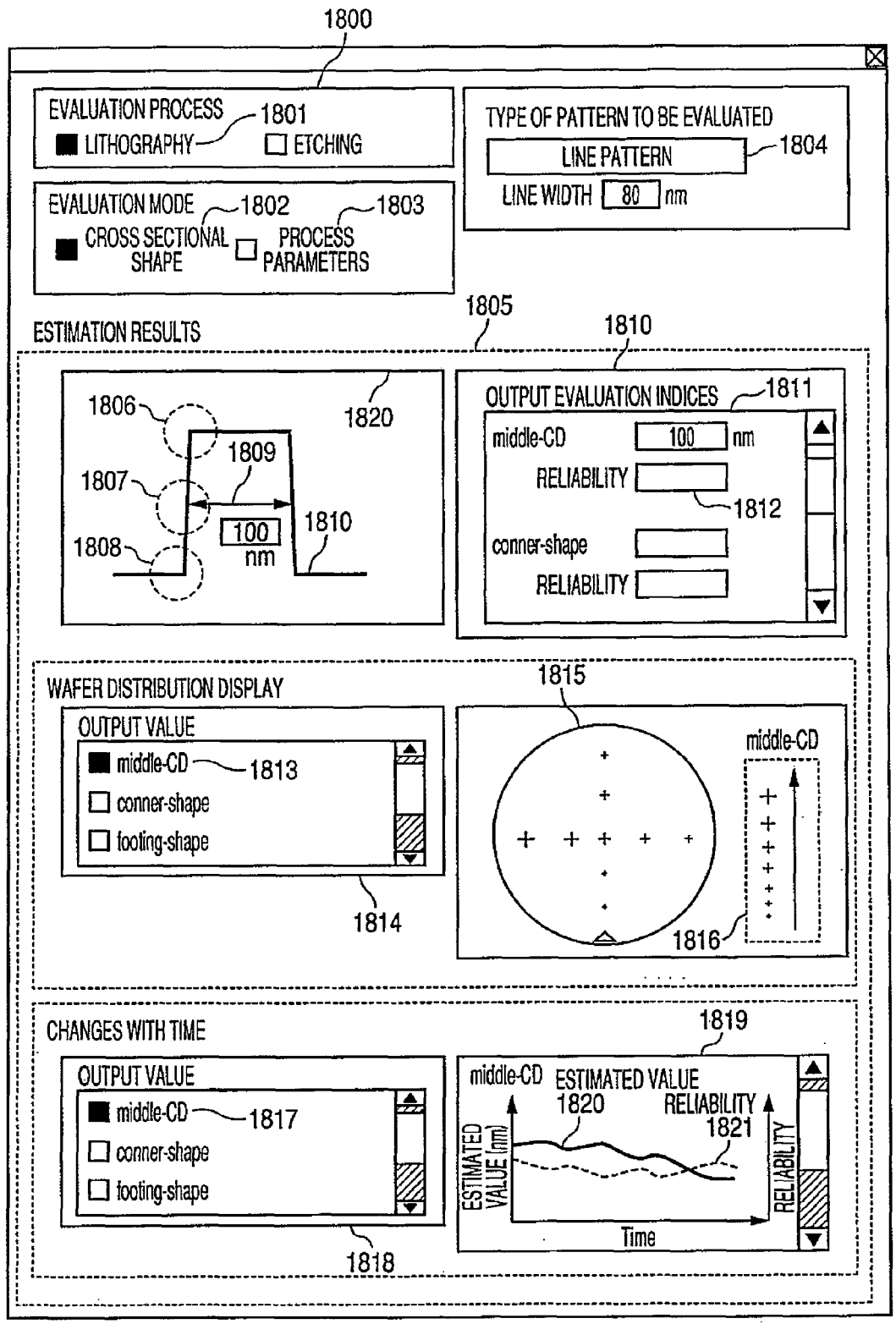
FIG. 25 is a diagram showing an example of a GUI screen menu for the performance process step.

Next, a description is given below of an example of screen display of a GUI 2 in the performance process steps 350, 550 as shown in FIG. 25, the GUI 2 being connected to the image-processing/arithmetic processing unit 407 of the semiconductor process estimation apparatus (cross-sectional shape or process parameter estimation apparatus) according to the present invention. This output GUI 2 makes it possible for the user to confirm detailed cross-sectional shape or process parameter estimation results in detail and in a readily understandable format. The output GUI 2 provides various items.

An item (1800) is used to display an evaluation process, and in this item, a process to be measured, such as lithography or etching, is displayed. Another item is used to display an evaluation mode, and in this item, cross-sectional shape estimation (1802) or process parameters (1803) are displayed.

An item (1804) is used to specify the type of pattern to be evaluated. For example, a line pattern or a hole pattern is displayed in this item.

An item (1820) is used to display calculation results on the cross-sectional shape being estimated. The calculated cross-sectional shape can be displayed graphically, and various measurement points and measurement results can be displayed in an overlaid fashion. For example, pattern width (1808), a corner shape (1806), a sidewall shape (1807), a footing shape (1808), a sidewall tilt angle, and so on are displayed.

An item (1810) is used to display calculated data measurements. For middle-CD management (1811), for example, estimated data is displayed and reliability (1812) of estimation results is also displayed together. In addition, a plurality of estimation results can be displayed in arrayed form.

An item (1815) in which, when the estimation results that were calculated from the pattern to be measured, and the reliability of the estimation results are calculated for a plurality of places on the wafer surface, distribution states of the estimation results and reliability on the wafer surface are displayed (1815). Any differences in data are represented as differences in display color or in brightness level (1816), and a distribution of these differences on the wafer surface is displayed. The measurement subject displayed in this item can be specified (1814), and a plurality of index values can be selected from a list of evaluation indices (1813) and displayed. Time-varying changes in the cross-sectional shape or process parameters obtained from the pattern to be measured are also displayed (1819).

In the present example, time is plotted on a horizontal axis and the cross-sectional shape or process parameters estimated are plotted on a vertical axis (1820). The display items in the example are GUI-specifiable (1818), and a plurality of evaluation indices can be selected from the list and displayed (1817). Time-varying changes in the reliability (1821) of the estimation results can also be displayed together with the above data. This GUI is an example of a method of estimating changes in time, and the user can monitor constantly changing pattern-forming parameters by monitoring, as described above, time-varying changes in estimation results and in the reliability of the estimation results.

The above-described display items in the estimation apparatus with GUI output are examples. However, since calculation results can be displayed to the user in detail in this fashion, it is possible to response to various process management needs and to supply process management status information to the user in a readily understandable format by displaying each item graphically.

According to the present invention, it is possible to calculate the cross-sectional shape of the pattern which has been formed in an exposure process or an etching process, from a SEM image without destructing or damaging the pattern to be evaluated. Consequently, this technique makes highly efficient process management possible and has high industrial applicability.

The invention may be embodied in other specific forms without departing from the spirit or essential characteristics thereof. The present embodiment is therefore to be considered in all respects as illustrative and not restrictive, the scope of the invention being indicated by the appended claims, rather than by the following description, and all changes that come within the meaning and range of equivalency of the claims are therefore intended to be embraced therein.

What is claimed is:

1. A method for monitoring a semiconductor manufacturing process, comprising the steps of;
    acquiring a SEM image of a target pattern formed on a sample by using a SEM image acquisition unit;
    calculating feature quantities of textures which indicate a shape of a frequency distribution of signal strength of the target pattern by using a calculation unit; and
    estimating a state of the target pattern from the calculated feature quantities by referring a database which is created in advance and which indicates a relationship between an image characteristic quantities based on textural analysis at the top of the pattern and a measured data by using an estimating unit.

2. The method according to claim 1, wherein in the step of estimating, the state of the target pattern is estimated by using an estimating unit by referring the database which is created in advance in association with the image characteristic quantities based on textural analysis at the top of the pattern obtained from a SEM image of a second sample and a data obtained from measuring the second sample.

3. The method according to claim 1, wherein in the step of calculating, the image characteristic quantities based on textural analysis at the top of the pattern are calculated by the calculation unit by estimating a frequency distribution of intensity signals of the SEM image of the target pattern, and quantifying the estimated frequency distribution.

4. The method according to claim 1, wherein in the step of acquiring, a SEM image of a target pattern formed on a sample is acquired by using the SEM image acquisition unit which is on a process of a semiconductor processing in which a predetermined process is completed to form the pattern on the sample.

5. The method according to claim 2, wherein the feature quantities of the textures obtained from the SEM image of the second sample by using the calculation unit are obtained from SEM images of patterns formed on the second sample which are at least one of having different cross-sectional shapes, being formed by different processing conditions, and having different device characteristics.

6. The method according to claim 1, wherein in the step of estimating, the measured data is obtained from measuring at least one of cross-sectional shapes of patterns, processing conditions and device characteristics by using the estimation unit.

7. The method according to claim 1, wherein in the step of estimating, at least one of cross-sectional shapes of the target pattern, processing conditions, and device characteristics is estimated by checking the image characteristic quantities based on textual analysis at the top of the pattern calculated in the calculating step to the database which indicates the relationship between an image characteristic quantities based on textural analysis at the top of the pattern and a measured data.

8. An apparatus for monitoring a semiconductor manufacturing process, comprising:
SEM image acquisition unit which acquires a SEM image of a target pattern formed on a sample;
calculating unit which calculates feature quantities of textures which indicate a shape of a frequency distribution of signal strength of the target pattern; and
estimating unit which estimates a state of the target pattern from the calculated feature quantities by referring a database which is created in advance and which indicates a relationship between an image characteristic quantities based on textural analysis at the top of the pattern and a measured data.

9. The apparatus according to claim 8, wherein in the estimating unit, the state of the target pattern is estimated by referring the database which is created in advance in association the image characteristic quantities based on textural analysis at the top of the pattern obtained from a SEM image of a second sample and a data obtained from measuring the second sample.

10. The apparatus according to claim 8, wherein in the calculating unit, the image characteristic quantities based on textural analysis at the top of the pattern are calculated by estimating a frequency distribution of intensity signals of the SEM image of the target pattern, and quantifying the estimated frequency distribution.

11. The apparatus according to claim 8, wherein in the SEM image acquiring unit, a SEM image of a target pattern formed on a sample is acquired which is on a process of a semiconductor processing in which a predetermined process is completed to form the pattern on the sample.

12. The apparatus according to claim 9, wherein the image characteristic quantities based on textural analysis at the top of the pattern obtained from SEM image of a second sample are obtained from SEM image of patterns formed on the second sample which are at least one of having different cross-sectional shapes, being formed by different processing conditions, and having different device characteristics.

13. The apparatus according to claim 8, wherein the estimating unit, the measured data is obtained from measuring at least one of cross-sectional shapes of patterns, processing conditions and device characteristics.

14. The apparatus according to claim 8, wherein the estimating unit, at least one of cross-sectional shapes of the target pattern, processing conditions, and device characteristics is estimated by checking the image characteristic quantities based on textural analysis at the top of the pattern calculated in the calculating step to the database which indicates the relationship between an image characteristic quantities based on textual analysis at the top of the pattern and a measured data.

* * * * *